United States Patent
Osame et al.

(10) Patent No.: US 7,923,937 B2
(45) Date of Patent: Apr. 12, 2011

(54) LIGHT EMITTING DEVICE AND DRIVING METHOD THEREOF

(75) Inventors: Mitsuaki Osame, Kanagawa (JP); Aya Anzai, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1062 days.

(21) Appl. No.: 11/573,426

(22) PCT Filed: Aug. 10, 2005

(86) PCT No.: PCT/JP2005/014968
§ 371 (c)(1),
(2), (4) Date: Feb. 8, 2007

(87) PCT Pub. No.: WO2006/016706
PCT Pub. Date: Feb. 16, 2006

(65) Prior Publication Data
US 2009/0224676 A1    Sep. 10, 2009

(30) Foreign Application Priority Data
Aug. 13, 2004 (JP) ................................ 2004-236094

(51) Int. Cl.
*G09G 3/10* (2006.01)
(52) U.S. Cl. ..................... 315/169.3; 345/82
(58) Field of Classification Search .................. 315/119, 315/169.1–169.4, 167, 168; 313/495; 345/76–78, 345/82, 83, 204
See application file for complete search history.

(56) References Cited

U.S. PATENT DOCUMENTS

| 5,594,463 | A | 1/1997 | Sakamoto |
| 6,225,912 | B1* | 5/2001 | Tanaka et al. .................. 362/800 |
| 6,400,101 | B1* | 6/2002 | Biebl et al. ...................... 315/291 |
| 6,528,951 | B2* | 3/2003 | Yamazaki et al. .......... 315/169.3 |
| 6,720,198 | B2 | 4/2004 | Yamagata et al. |
| 6,724,156 | B2* | 4/2004 | Fregoso ......................... 315/291 |
| 6,853,370 | B2 | 2/2005 | Numao |
| 2001/0033252 | A1* | 10/2001 | Yamazaki et al. .............. 345/82 |
| 2002/0089496 | A1 | 7/2002 | Numao |
| 2003/0122749 | A1* | 7/2003 | Booth et al. ..................... 345/82 |
| 2003/0214467 | A1* | 11/2003 | Koyama et al. ................. 345/82 |
| 2004/0100463 | A1 | 5/2004 | Miyagawa et al. |
| 2004/0178726 | A1 | 9/2004 | Yamagata et al. |

(Continued)

FOREIGN PATENT DOCUMENTS
JP    02-287492    11/1990
(Continued)

OTHER PUBLICATIONS

International Search Report (Application No. PCT/JP2005/014968) mailed Nov. 22, 2005.

(Continued)

*Primary Examiner* — Jacob Y Choi
*Assistant Examiner* — Ephrem Alemu
(74) *Attorney, Agent, or Firm* — Fish & Richardson P.C.

(57) ABSTRACT

The light emitting device has a limiter transistor which is connected to a monitoring element, and an inverter an output terminal of which is connected to a gate electrode of the limiter transistor and an input terminal of which is connected to one electrode of the limiter transistor and the monitoring element. In the case where the monitoring element is short-circuited, the limiter transistor can be turned off by the inverter to correct a defect of the monitoring element.

24 Claims, 16 Drawing Sheets

U.S. PATENT DOCUMENTS

| | | |
|---|---|---|
| 2007/0132793 A1 | 6/2007 | Miyagawa et al. |
| 2009/0122049 A1 | 5/2009 | Miyagawa et al. |
| 2010/0020060 A1 | 1/2010 | Miyagawa et al. |

FOREIGN PATENT DOCUMENTS

| | | |
|---|---|---|
| JP | 04-128875 | 4/1992 |
| JP | 05-283748 | 10/1993 |
| JP | 07-036409 | 2/1995 |
| JP | 11-087774 | 3/1999 |
| JP | 2002-278498 | 9/2002 |
| JP | 2002-318546 | 10/2002 |
| JP | 2003-317944 | 11/2003 |
| JP | 2004-170943 | 6/2004 |
| WO | WO 2004/040541 A1 | 5/2004 |

OTHER PUBLICATIONS

Written Opinion (Application No. PCT/JP2005/014968) mailed Nov. 22, 2005.

European Search Report issued in Application No. 05772562.4, dated Mar.11, 2010, 7 pages.

* cited by examiner

LIGHT EMITTING DEVICE AND DRIVING METHOD THEREOF

TECHNICAL FIELD

The present invention relates to a light emitting device which has a self-light emitting element, and a driving method thereof.

BACKGROUND ART

In recent years, a light emitting device including a light emitting element typified by an EL (Electro Luminescence) element has been developed, and it is expected to be widely used, by taking advantage of high quality, wide viewing angle, thin size, lightweight, and the like because of a self-light emitting type.

Such light emitting elements may have degradation with time and an initial defect. Proposed is a method that an anode surface of a light emitting element is wiped using a PVA (polyvinyl alcohol) porous body and the like, so that planarization and the removal of dust are achieved to prevent the degradation with time and initial defect (referred to Reference 1).

[Reference 1]
Japanese Patent Application Laid-Open No. 2002-318546

DISCLOSURE OF INVENTION

A primary object of the invention is to solve the aforementioned degradation with time and initial defect of a light emitting element by a new method that is different from Reference 1 aforementioned.

In view of the problem, according to the invention, a voltage or a current which is supplied to a light emitting element is corrected by providing a monitoring light emitting element in a portion of a light emitting device and taking into consideration the change of the monitoring light emitting element.

Specifically, one mode of the invention is a light emitting device which has a plurality of monitoring light emitting elements, a monitor line which monitors a change of a potential of electrodes of the plurality of monitoring light emitting elements, and a means for interrupting a current which is supplied to a short-circuited monitoring light emitting element through the monitor line in the case where any one of the plurality of monitoring light emitting elements is short-circuited.

Another mode of the invention is a light emitting device which has a monitoring light emitting element, a monitor controlling transistor one electrode of which is connected to the monitoring light emitting element, and an inverter an output terminal of which is connected to a gate electrode of the monitor controlling transistor and an input terminal of which is connected to the one electrode of the monitor controlling transistor and the monitoring light emitting element.

Another mode of the invention is a driving method of a light emitting device which has a monitoring light emitting element and a monitor controlling transistor which is connected to the monitoring light emitting element, includes the steps of turning off the monitor controlling transistor when the monitoring light emitting element is short-circuited.

To achieve the aforementioned driving method, an inverter is a circuit which has a function to turn off a monitor controlling transistor in the case where a monitoring light emitting element is short-circuited. Therefore, the invention is not limited to the inverter and other circuits having the aforementioned function may be used.

A monitoring light emitting element is produced in the same steps as a plurality of light emitting elements which are provided in a pixel portion, therefore the monitoring light emitting element and the plurality of light emitting elements have the same or almost the same characteristics with respect to an environmental temperature at which a light emitting device is set (merely referred to as ambient temperature), and a change with time (since degradation is caused in many cases, referred to as degradation with time).

The invention can provide a light emitting device in which luminance variations due to the change in ambient temperature and the degradation with time are reduced.

BEST MODE FOR CARRYING OUT THE INVENTION

Although the invention will be fully described by way of Embodiment Modes and Embodiments with reference to the accompanying drawings, it is to be understood that various changes and modifications will be apparent to those skilled in the art. Therefore, unless otherwise such changes and modifications depart from the scope of the invention, they should be construed as being included therein. Note that in all diagrams for describing embodiment modes, same portions or portions which have a similar function are denoted by like numerals and will be explained in no more details.

Note that in this specification, a connection between each element means electrical connection. Therefore, elements may be connected to each other through a semiconductor element, a switching element and the like.

Further, in this specification, a source electrode and a drain electrode of a transistor are names for distinguishing electrodes other than a gate electrode for the sake of convenience because of a transistor configuration. In the case where the conductivity of a transistor is not limited, the source electrode and the drain electrode are changed in name in the invention depending on the conductivity of the transistor. Therefore, a source electrode or a drain electrode may be described as any of one electrode and the other electrode.

Embodiment Mode 1

This embodiment mode describes a panel configuration which has a monitoring light emitting element.

Figure 1:
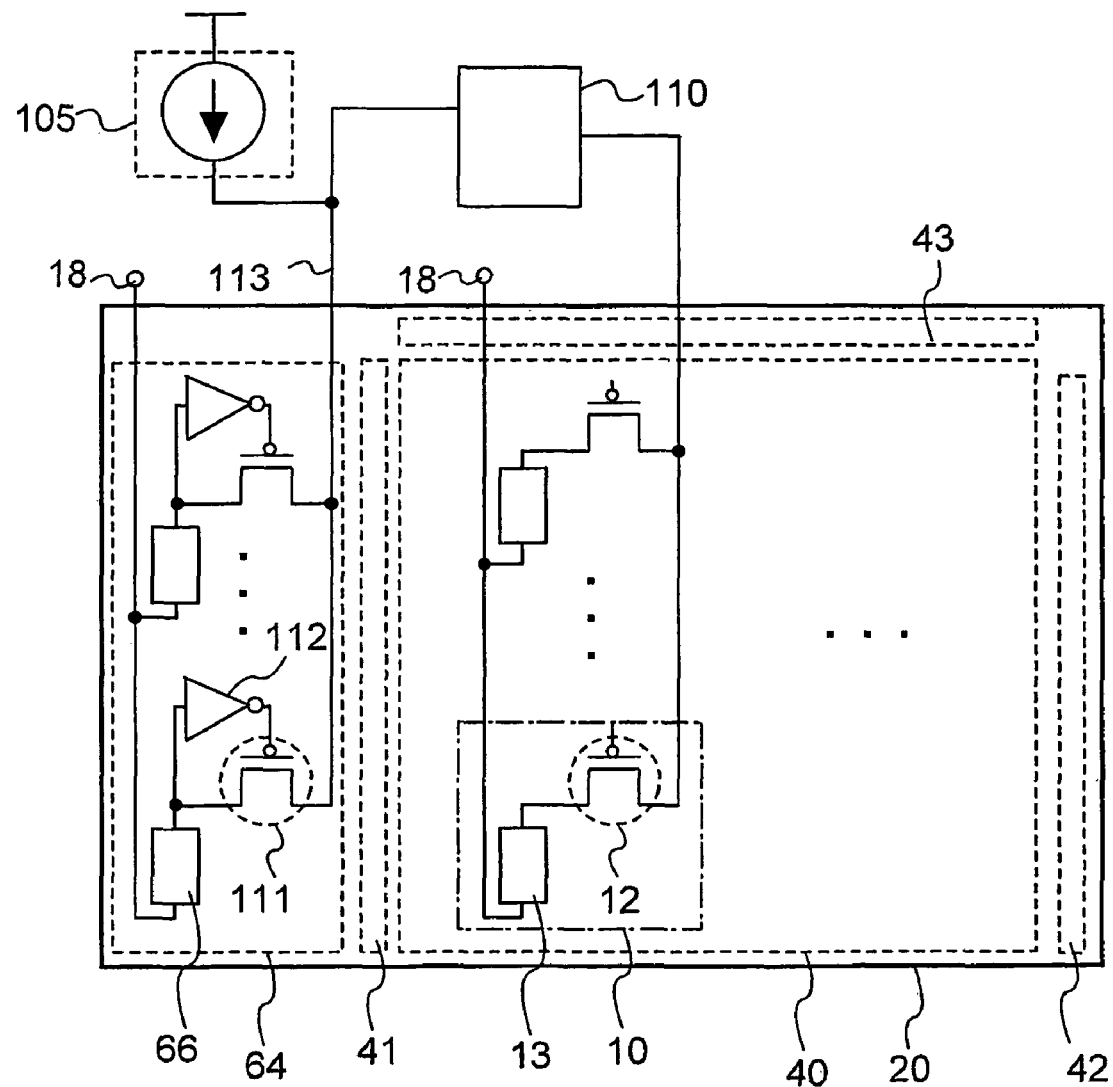
FIG. 1 is a view showing a light emitting device of the invention.

In FIG. 1, a pixel portion 40, a signal line driving circuit 43, a first scanning line driving circuit 41, a second scanning line driving circuit 42, and a monitoring circuit 64 are provided over an insulating substrate 20.

A plurality of pixels 10 are provided in the pixel portion 40, and each pixel includes a light emitting element 13 and a transistor (hereinafter referred to as a driving transistor) 12 which is connected to the light emitting element 13 and functions to control current supply. The light emitting element 13 is connected to a power source 18. Note that a specific configuration of the pixel 10 is exemplified in the following embodiment modes.

The monitoring circuit 64 has a monitoring light emitting element 66, a transistor (hereinafter referred to as a monitor controlling transistor) 111 which is connected to the monitoring light emitting element 66, and an inverter 112 an output terminal of which is connected to a gate electrode of the monitor controlling transistor 111 and an input terminal of which is connected to one electrode of the monitor controlling transistor 111 and the monitoring light emitting element 66. A constant current source 105 is connected to the monitor controlling transistor 111 through a monitoring current line (hereinafter referred to as a monitor line) 113. The monitor controlling transistor 111 functions to control a current supply from the monitor line 113 to each of the plurality of monitoring light emitting elements 66. Since the monitor line 113 is connected to electrodes of the plurality of monitoring light emitting elements 66, it can function to monitor a change of the potential of the electrodes. Further, the constant current source 105 may function to supply a constant current to the monitor line 113.

The monitoring light emitting element 66 and the light emitting element 13 are produced in the same steps under the same conditions, and thus have the same configuration. Therefore, the monitoring light emitting element and the light emitting element have the same or almost the same characteristics with respect to the change in ambient temperature and the degradation with time. Such monitoring light emitting elements 66 are connected to the power source 18. Herein, the power source connected to the light emitting element 13 and the power source connected to the monitoring light emitting element 66 have the same potential, therefore, they are denoted by the same reference numeral: the power source 18. Note that, in this embodiment mode, the conductivity of the monitor controlling transistor 111 is described as the P-channel type, though the invention is not limited thereto, and the N-channel type may be used, in which case a periphery circuit configuration is changed at discretion.

A position in which such a monitoring circuit 64 is provided is not limited and may be provided between the signal line driving circuit 43 and the pixel portion 40, or between the first scanning line driving circuit 41 or the second scanning line driving circuit 42 and the pixel portion 40.

A buffer amplifier circuit 110 is provided between the monitoring circuit 64 and the pixel portion 40. The buffer amplifier circuit is a circuit having characteristics such that an input and an output are at the same potential, input impedance is high, and output current capacity is high. Therefore, a circuit configuration can be determined at discretion as long as it has these characteristics.

In such a configuration, the buffer amplifier circuit 110 functions to change voltage which is applied to the light emitting element 13 in the pixel portion 40 in accordance with a change of the potential of one electrode of the monitoring light emitting element 66.

In such a configuration, the constant current source 105 and the buffer amplifier circuit 110 may be provided over the same insulting substrate 20 or another substrate.

In the aforementioned configuration, a constant current is supplied from the constant current source 105 to the monitoring light emitting element 66. In this condition, when ambient temperature change or degradation with time occurs, a resistance value of the monitoring light emitting element 66 is changed. For example, when degradation with time occurs, the resistance value of the monitoring light emitting element 66 increases. Then, since a current value which is supplied to the monitoring light emitting element 66 is constant, a potential difference between both terminals of the monitoring light emitting element 66 is changed. Specifically, a potential difference between both electrodes of the monitoring light emitting element 66 is changed. At this time, because the potential of an electrode connected to the power source 18 is fixed, the potential of an electrode connected to the constant current source 105 is changed. The change of the potential of the electrode is supplied to the buffer amplifier circuit 110 through the monitor line 113.

That is, the change of the potential of the electrode is inputted to an input terminal of the buffer amplifier circuit 110. A potential outputted from an output terminal of the buffer amplifier circuit 110 is supplied to the light emitting element 13 through the driving transistor 12. Specifically, an outputted potential is given as the potential of one electrode of the light emitting element 13.

Thus, a change of the monitoring light emitting element 66 due to a change of ambient temperature and degradation with time is fed back to the light emitting element 13. As a result, the light emitting element 13 can emit light with a luminescence corresponding to the change of ambient temperature and the degradation with time. Therefore, a light emitting device which can display images independently of a change of ambient temperature and degradation with time can be provided.

Further, because the plurality of monitoring light emitting elements 66 are provided, the potential changes thereof can be averaged and supplied to the light emitting element 13. In other words, in the invention, potential changes can be averaged by providing the plurality of monitoring light emitting elements 66, which is preferable.

A monitoring light emitting element in which a short-circuit and the like occurs can be replaced by providing the plurality of monitoring light emitting elements 66.

Furthermore, in the invention, the monitor controlling transistor 111 and the inverter 112 which are connected to the monitoring light emitting element 66 are provided taking into consideration malfunction of the monitoring circuit 64 due to a defect (including an initial defect and a defect with time) of the monitoring light emitting element 66. For example, in the case where the constant current source 105 and the monitor controlling transistor 111 are connected without other transistors and the like interposed therebetween, an anode and a cathode of one monitoring light emitting element 66 of the plurality of monitoring light emitting elements are short-circuited by a defect and the like in production steps. Then, a current from the constant current source 105 is supplied a lot to the monitoring light emitting element 66 which is short-circuited through the monitor line 113. Since the plurality of monitoring light emitting elements are connected in parallel to each other, when much current is supplied to the monitoring light emitting element 66 which is short-circuited, a predetermined constant current is not supplied to the other monitoring light emitting elements. As a result, an appropriate potential change of the monitoring light emitting element 66 cannot be supplied to the light emitting element 13.

An anode potential and a cathode potential of the monitoring light emitting element become the same by such a short-circuit of the monitoring light emitting element. For example, in production steps, dust and the like between an anode and a cathode may cause a short-circuit. Further, the monitoring light emitting element may be short-circuited in the case of a short-circuited between a scanning line and an anode and the like as well as a short-circuit between an anode and a cathode.

In view of the foregoing, according to the invention, the monitor controlling transistor 111 and the inverter 112 are provided. The monitor controlling transistor 111 stops current supply to the monitoring light emitting element 66 which is short-circuited to prevent much current from being supplied to the monitoring light emitting element 66 due to the short-circuit and the like. That is to say, the monitor controlling transistor 111 disconnects the short-circuited monitoring light emitting element from the monitor line.

The inverter 112 functions to output a potential at which the monitor controlling transistor is turned off when any one of the plurality of monitoring light emitting elements is short-circuited. In addition, the inverter 112 functions to output a potential at which the monitor controlling transistor is turned on when none of the plurality of monitoring light emitting elements are short-circuited.

Figure 5A:
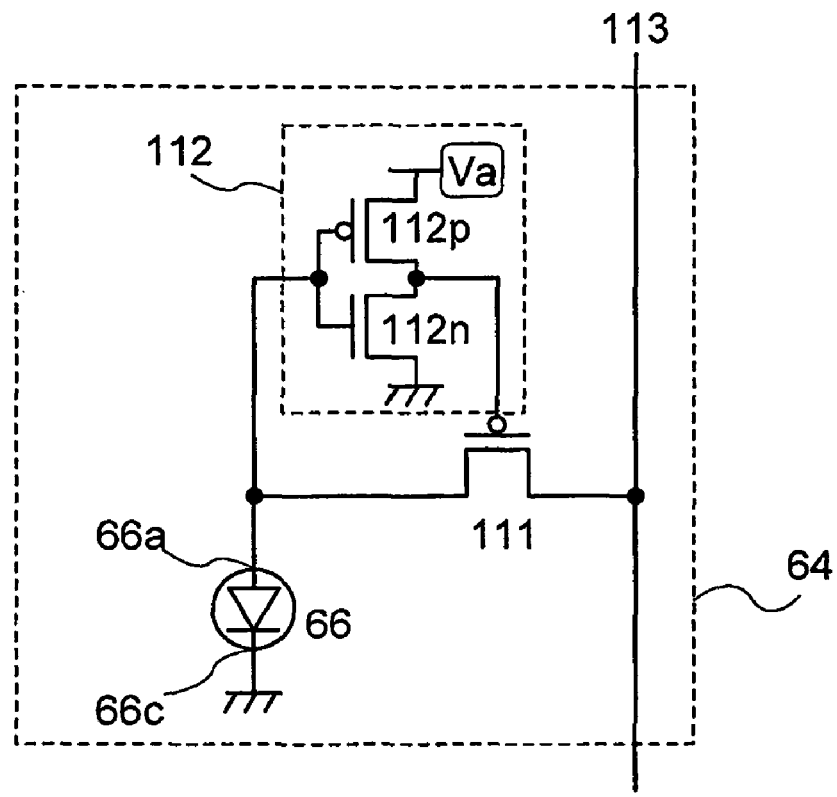
FIGS. 5A and 5B are views showing a monitoring circuit of the invention and potential of each lines, respectively.
Figure 5B:
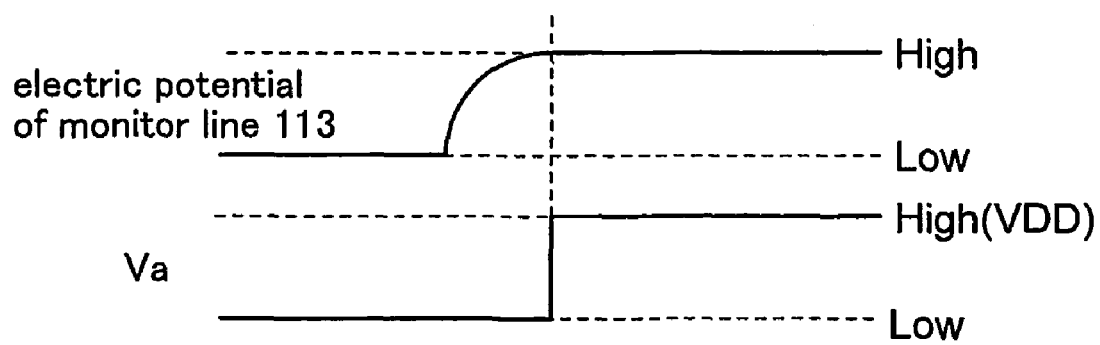

An operation of the monitoring circuit 64 is described in detail with reference to FIGS. 5A and 5B. As illustrated in FIG. 5A, the monitoring light emitting element 66 has an anode electrode 66a on a high potential side and a cathode electrode 66c on a low potential side. The anode electrode 66a is connected to an input terminal of the inverter 112. The cathode electrode 66c is connected to the power source 18, which becomes a fixed potential. Therefore, when the anode and the cathode of the monitoring light emitting element 66 are short-circuited, a potential of the anode electrode 66a becomes close to a potential of the cathode electrode 66c. As a result, a low potential which is close to the potential of the cathode electrode 66c is supplied to the inverter 112 so that a P-channel transistor 112p included in the inverter 112 is turned on. Then, a potential (Va) of a high potential side is outputted from the inverter 112, which becomes a gate potential of the monitor controlling transistor 111. That is, a potential inputted to a gate of the monitor controlling transistor 111 becomes Va, and the monitor controlling transistor 111 is turned off.

Note that a high side potential (High) VDD is set to be equal to or higher than an anode potential. Further, a low side potential of the inverter 112, a potential of the power source 18, a low side potential of the monitor line 113, and a low side potential applied to Va can be made equal to each other. In general, a low side potential is ground, though the invention is not limited thereto, and the low side potential may be determined to have a predetermined potential difference with a high side potential. The predetermined potential difference can be determined by current characteristics, voltage characteristics, and luminescence characteristics of a light emitting material, or device specifications.

Herein, the order of supplying a constant current to the monitoring light emitting element 66 is paid attention to. It is required to start supplying a constant current to the monitor line 113 while the monitor controlling transistor 111 is in an on-state. In this embodiment mode, a current starts flowing to the monitor line 113 while keeping Va at Low as shown in FIG. 5B. Then, Va is to be a VDD after a potential of the monitor line 113 reaches a saturation state. As a result, even though the monitor controlling transistor 111 is in an on-state, the monitor line 113 can be charged.

On the other hand, in the case where the monitoring light emitting element 66 is not short-circuited, a potential of the anode electrode 66a is supplied to the inverter 112 so that an N-channel transistor 112 is turned on. Then, a potential of a low potential side is outputted from the inverter 112 so that the monitor controlling transistor 111 is turned on.

Thus, a current from the constant current source 105 can be prevented from flowing to the monitoring light emitting element 66 which is short-circuited. Therefore, in the case where one of the plurality of monitoring light emitting elements is short-circuited, current supply to the monitoring light emitting element which is short-circuited is blocked so that a potential change of the monitor line 113 can be minimized. As a result, a current can be supplied to the light emitting element 13 in accordance with an appropriate potential change of the monitoring light emitting element 66.

Note that in this embodiment mode, the constant current source 105 may be any circuit as long as it can supply a constant current, and for example, a transistor can be used.

Further, in this embodiment mode, described is the case where the monitoring circuit 64 has the plurality of monitoring light emitting elements 66, the monitor controlling transistor 111, and the inverter 112, though the invention is not limited thereto. For example, the inverter 112 may be any circuit as long as it functions to detect a short-circuit of the monitoring light emitting element and to block current supply to the monitoring light emitting element which is short-circuited through the monitor line 113. Specifically, the inverter 112 may function to turn off the monitor controlling transistor in order to block a current supplied to the monitoring light emitting element which is short-circuited.

Further, this embodiment mode is preferable since the plurality of monitoring light emitting elements 66 are used and even when one of them has a defect, a monitor operation can be implemented. Further, the plurality of monitoring light emitting elements can average a monitor operation, which is preferable.

In this embodiment mode, the buffer amplifier circuit 110 is provided to prevent a potential change. Therefore, other circuits than the buffer amplifier circuit 110 may be used as long as they can prevent a potential change similarly to the buffer amplifier circuit 110. That is to say, when a potential of one electrode of the monitoring light emitting element 66 is transmitted to the light emitting element 13, any circuit as well as the buffer amplifier circuit 110 may be provided between the monitoring light emitting element 66 and the light emitting element 13 to prevent a potential change.

Embodiment Mode 2

This embodiment mode describes, differently from the aforementioned embodiment mode, a circuit configuration in which a monitor controlling transistor is turned off when a monitoring light emitting element is short-circuited, and an operation thereof.

Figure 6A:
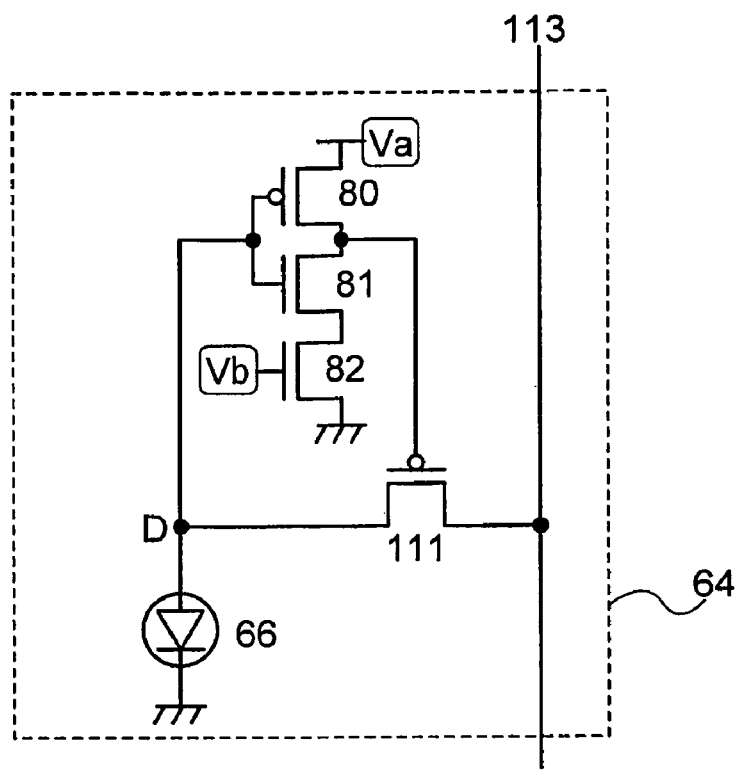
FIGS. 6A and 6B are views showing a monitoring circuit of the invention and potential of each lines, respectively.

The monitoring circuit 64 shown in FIG. 6A has a P-channel first transistor 80, an N-channel second transistor 81 which has a common gate electrode to the first transistor 80 and is connected in parallel to the first transistor 80, and an N-channel third transistor 82 which is connected in series to the second transistor. The monitoring light emitting element 66 is connected to gate electrodes of the first transistor 80 and the second transistor 81. A gate electrode of the monitor controlling transistor 111 is connected to an electrode to which both of the first transistor 80 and the second transistor 81 are connected. The other configuration is similar to the monitoring circuit 64 shown in FIG. 5A.

Figure 6B:
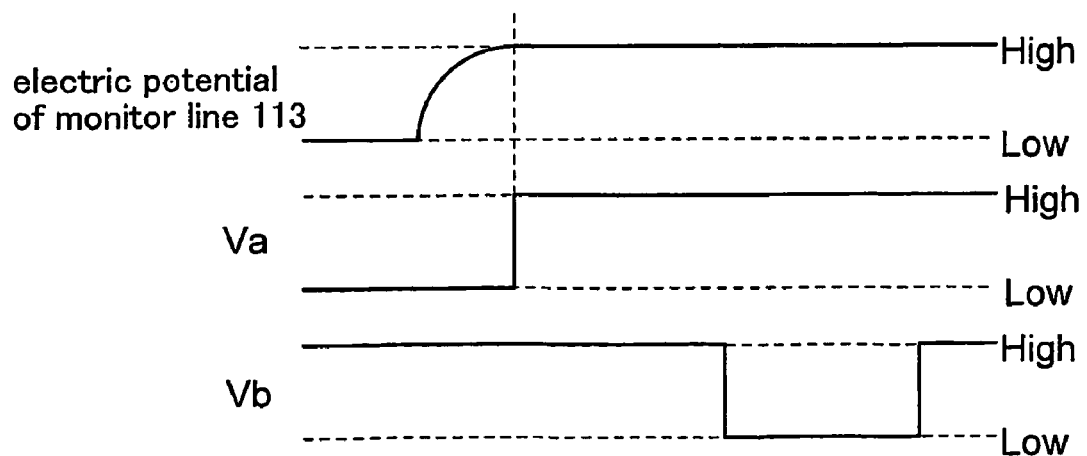

Further, it is assumed that a potential of a high potential side of the first P-channel transistor 80 is Va, while a potential of the gate electrode of the third N-channel transistor 82 is Vb. A potential of the monitor line 113, and potentials Va and Vb are operated as shown in FIG. 6B.

First, the potential of the monitor line 113 reaches a saturation state, thereafter, the potential Va becomes High. In the case where the monitoring light emitting element 66 is short-circuited, an anode potential of the monitoring light emitting element 66, that is, a potential at a point D decreases to almost the same as a cathode potential of the monitoring light emitting element 66. Then, a low potential, that is Low is inputted to the gate electrodes of the first transistor 80 and the second transistor 81, so that the N-channel second transistor 81 is turned off and the P-channel first transistor 80 is turned on. Then, a high side potential which is one potential of the first transistor 80 is inputted to the gate electrode of the monitor controlling transistor 111 to turn off the monitor controlling transistor 111. As a result, a current from the monitor line 113 is not supplied to the monitoring light emitting element 66 which is short-circuited.

At this time, in the case where a short-circuit level is low and an anode potential decreases slightly, which of the first transistor 80 and the second transistor 81 is turned on or off is difficult to be controlled. Then, the potential Vb is supplied to the gate electrode of the third transistor 82 as shown in FIG. 6A. That is to say, while the potential Va is at High, the potential Vb is at Low as shown in FIG. 6B. Then, the N-channel third transistor 82 is turned off. As a result, if an anode potential is a potential obtained by subtracting a threshold voltage of the first transistor 80 from VDD, the first transistor 80 can be turned on and the monitor controlling transistor 111 can be turned off.

By controlling the potential Vb in the aforementioned manner, even when an anode potential decreases slightly, the monitor controlling transistor 111 can be turned off accurately.

Note that, in the case where the monitoring light emitting element operates normally, the monitor controlling transistor 111 is controlled to be turned on. That is to say, an anode potential becomes almost the same as the high potential of the monitor line 113 so that the second transistor 81 is turned on. As a result, the low potential is applied to the gate electrode of the monitor controlling transistor 111 so that the monitor controlling transistor is turned on.

Figure 7A:
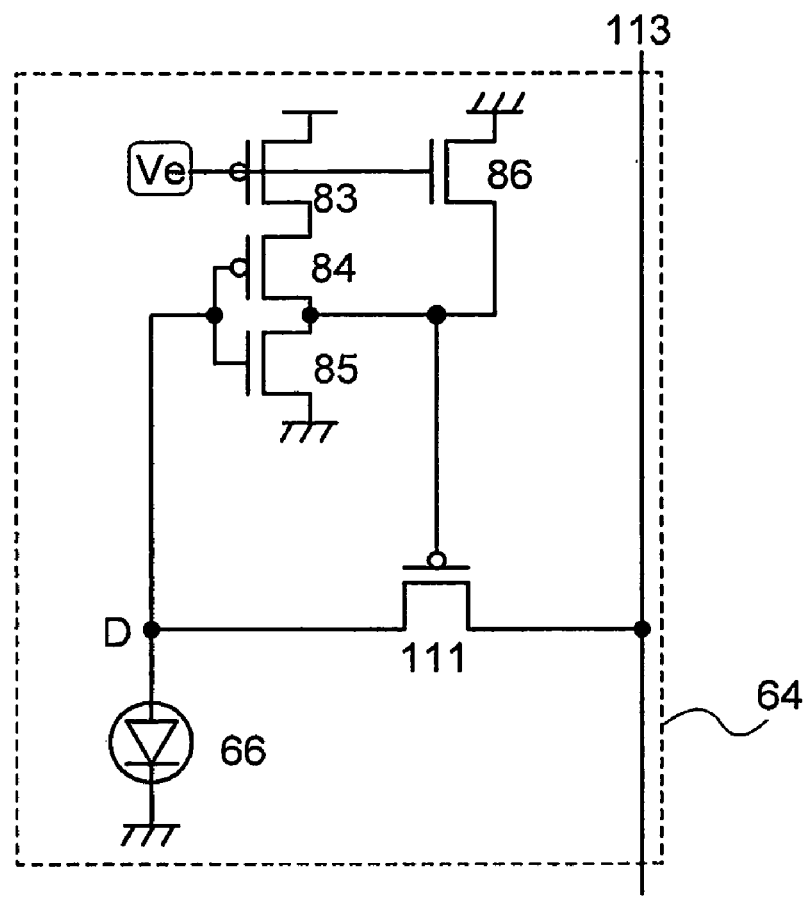
FIGS. 7A and 7B are views showing a monitoring circuit of the invention and potential of each lines, respectively.
Figure 7B:
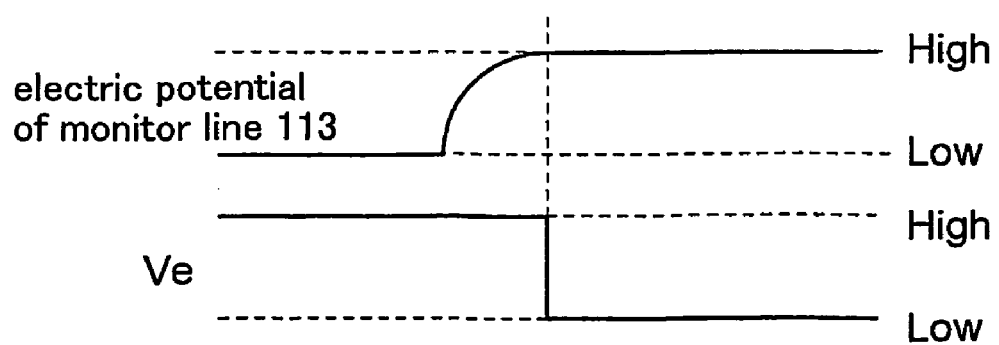

Further, as shown in FIG. 7A, the monitor circuit 64 has a P-channel first transistor 83, a P-channel second transistor 84 which is connected in series to the first transistor 83, an N-channel third transistor 85 which has a common gate electrode to the second transistor 84, and an N-channel fourth transistor 86 which has a common gate electrode to the first transistor 83 and is connected in parallel to the first transistor 83. The monitoring light emitting element 66 is connected to the gate electrodes of the second transistor 84 and the third transistor 85. The gate electrode of the monitor controlling transistor 111 is connected to an electrode to which the second transistor 84 and the third transistor 85 are connected. Further, the gate electrode of the monitor controlling transistor 111 is connected to one electrode of the fourth transistor 86. The other circuit configuration is similar to the monitoring circuit 64 shown in FIG. 5A.

First, the potential of the monitor line 113 reaches a saturation state, thereafter, a potential Ve becomes Low. In the case where the monitoring light emitting element 66 is short-circuited, an anode potential of the monitoring light emitting element 66, that is, a potential at a point D decreases to almost the same as a cathode potential of the monitoring light emitting element 66. Then, a low potential, that is Low is inputted to the gate electrodes of the second transistor 84 and the third transistor 85, so that the N-channel third transistor 85 is turned off while the P-channel second transistor 84 is turned on. In the case where the potential Ve is Low, the first transistor 83 is turned on while the fourth transistor 86 is turned off. Then, a high side potential of the first transistor 83 is inputted to the gate electrode of the monitor controlling transistor 111 through the second transistor 84, and the monitor controlling transistor 111 is turned off. As a result, a current from the monitor line 113 is not supplied to the monitoring light emitting element 66 which is short-circuited.

The potential Ve of the gate electrode is controlled in the abovementioned manner so that the monitor controlling transistor 111 can be turned off accurately.

Embodiment Mode 3

In the invention, a reverse bias voltage can be applied to a light emitting element and a monitoring light emitting element. In this embodiment mode, described is the case where a reverse bias voltage is applied.

On the assumption that a voltage applied when the light emitting element 13 and the monitoring light emitting element 66 emit light is a forward bias voltage, a reverse bias voltage is a voltage in which a high side potential and a low side potential of the forward bias voltage are inverted. Specifically, when a description is made by using the monitoring light emitting element 66, the potential of the monitor line 113 becomes lower than the potential of the power source 18 so that the potential of the anode electrode 66a and the potential of the cathode electrode 66c are inverted.

Figure 13:
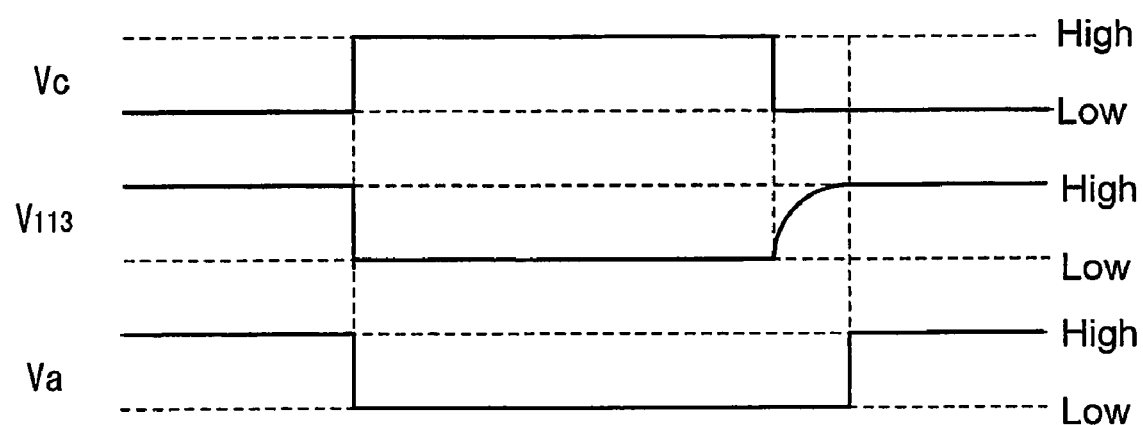
FIG. 13 is a view showing a timing chart of the invention.

Specifically, the potential of the anode electrode 66a (anode potential: Va) is changed from High to Low as shown in FIG. 13, and the potential of the cathode electrode 66c (cathode potential: Vc) is changed from Low to High. At this time, a potential ($V_{113}$) of the monitor line 113 is also changed from High to Low. The period during which the anode potential and the cathode potential are inverted is referred to as a reverse bias voltage application period. After a predetermined reverse bias voltage application period passes, the cathode potential is returned from High to Low so that a constant current flows to the monitor line 113 and charge is completed. Thereafter, that is after a voltage of the monitor line 113 becomes High, an anode line potential is returned from Low to High. At this time, the potential of the monitor line 113 is returned in a curve with time because the plurality of monitoring light emitting elements are charged with a constant current, and further parasitic capacitance is charged.

It is preferable that the anode potential be inverted before the cathode potential is inverted. After a predetermined reverse bias voltage application period passes, the anode potential is returned and then the cathode potential is returned. In synchronism with the inversion of the anode potential, the potential of the monitor line 113 becomes High.

In the reverse bias voltage application period, the driving transistor 12 and the monitor controlling transistor 111 are required to be on.

As a result of applying the reverse bias voltage to the light emitting element, defects of the light emitting element 13 and the monitoring light emitting element 66 can be improved to increase reliability. Further, the light emitting element 13 and the monitoring light emitting element 66 may have an initial defect where an anode and a cathode are short-circuited due to adhesion of foreign materials, a pinhole caused by a small projection in the anode or the cathode, and nonuniformity of an electroluminescent layer. In the case where such an initial defect occurs, lighting and non-lighting corresponding to a signal are not performed and most current flows to a short-circuited element. As a result, a problem that an image is not displayed well occurs. This defect may occur in an arbitrary pixel.

In view of the aforementioned, in this embodiment mode, a reverse bias voltage is applied to the light emitting element 13 and the monitoring light emitting element 66, thereby a current partially flows to a short-circuited portion, and the short-circuited portion generates heat to be oxidized or carbonized. As a result, the short-circuited portion can be insulated, a current flows to the other parts of the short-circuited portion, and the light emitting element 13 and the monitoring light emitting element 66 can operate normally. By applying a reverse bias voltage in this manner, even in the case where an initial defect occurs, the defect can be corrected. Note that such insulation of the short-circuited portion may be performed before shipment of a display device.

As time passes, another short-circuit between an anode and a cathode as well as the initial defect may occur. Such a defect is also referred to as a progressive defect. According to the invention, a reverse bias voltage is periodically applied to the light emitting element 13 and the monitoring light emitting element 66 so that, even when a progressive defect occurs, the defect can be corrected and the light emitting element 13 and the monitoring light emitting element 66 can operate normally.

In addition, application of a reverse bias voltage can prevent image burn-in. Image burn-in occurs by the light emitting element 13 which has degraded, though application of a reverse bias voltage can reduce the degradation. As a result, image burn-in can be prevented.

In general, degradation of the light emitting element 13 and the monitoring light emitting element 66 progresses rapidly in the initial stage and gradually slows down as time passes. That is, in a pixel, the light emitting element 13 and the monitoring light emitting element 66 which have degraded in the initial stage do not degrade easily. As a result, there occur variations in each light emitting element 13. Therefore, before shipment, when no image is displayed and the like, all the light emitting elements 13 and the monitoring light emitting elements 66 emit light to cause degradation of elements which have not degraded, so that the degradation level of all the elements can be averaged. Such a configuration in which all the elements emit light may be provided in a light emitting device.

Embodiment Mode 4

In this embodiment mode, another example of a pixel circuit is described.

Figure 2:
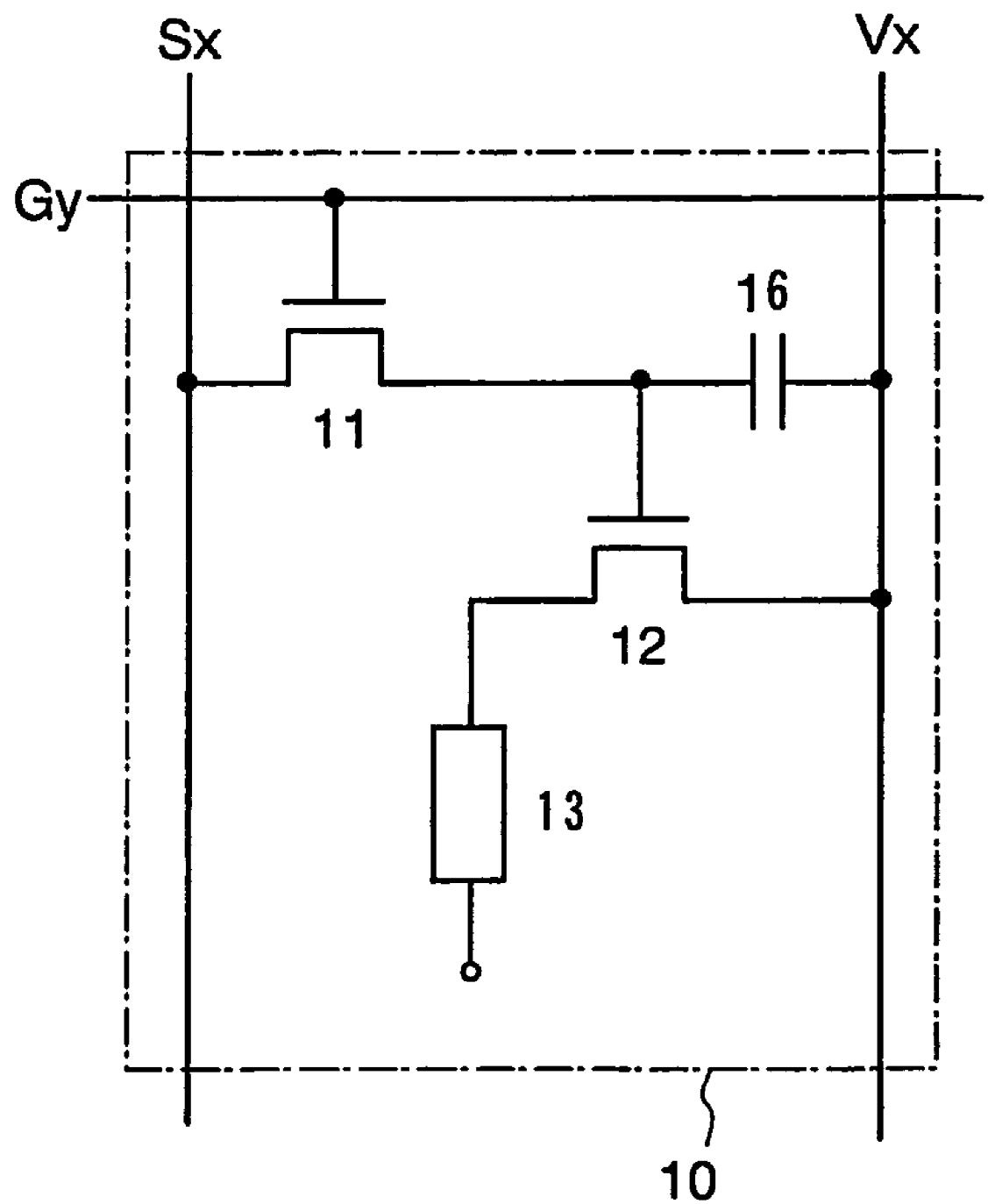
FIG. 2 is a view showing an equivalent circuit of a pixel of the invention.

FIG. 2 shows a pixel circuit which can be used in the pixel portion of the invention. The pixel portion 40 includes a signal line Sx, a scanning line Gy, and a power source line Vx which are arranged in matrix, and the pixel 10 is provided at each intersection thereof. The pixel 10 has the switching transistor 11, the driving transistor 12, a capacitor 16, and the light emitting element 13.

A connection relation of the pixel is described. The switching transistor 11 is provided at the intersection of the signal line Sx and the scanning line Gy. One electrode of the switching transistor 11 is connected to the signal line Sx, while a gate electrode of the switching transistor 11 is connected to the scanning line Gy. One electrode of the driving transistor 12 is connected to the power source line Vx, while a gate electrode thereof is connected to the other electrode of the switching transistor 11. The capacitor 16 is provided to hold a gate-source voltage of the driving transistor 12. In this embodiment mode, one electrode of the capacitor 16 is connected to the power source line Vx, while the other electrode is connected to the gate electrode of the driving transistor 12. Note that the capacitor 16 is not required to be provided in the case where a gate capacitance of the driving transistor 12 is large, a leakage current is small and the like. The light emitting element 13 is connected to the other electrode of the driving transistor 12.

A driving method of such a pixel is described.

First, when the switching transistor 11 is turned on, a video signal is inputted from the signal line Sx. Charges are accumulated in the capacitor 16 based on the video signal. When the charges accumulated in the capacitor 16 exceed the gate-source voltage (Vgs) of the driving transistor 12, the driving transistor 12 is turned on. Then, a current is supplied to the light emitting element 13 and the light emitting element 13 emits light. At this time, the driving transistor 12 can be operated in the linear region or the saturation region. When the driving transistor 12 is operated in the saturation region, it can supply a constant current, while when operated in the linear region, it can be operated at a low voltage to achieve lower power consumption.

A driving method of a pixel is hereinafter described with reference to a timing chart.

Figure 8A:
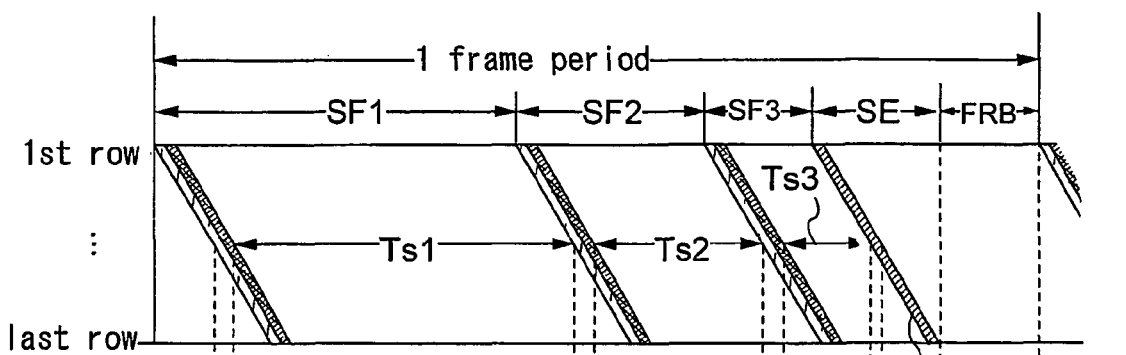
FIGS. 8A and 8B are views showing a timing chart of the invention.

FIG. 8A shows a timing chart of one-frame period in the case where sixty-frame images are rewritten per second. In the timing chart, the ordinate shows a scanning line G (from the first row to the last row), while the abscissa shows time.

One-frame period has m (m is a natural number of two or more) subframe periods SF1, SF2, . . . , SFm, which have writing periods Ta1, Ta2, . . . , Tam and display periods (lighting period) Ts1, Ts2, . . . , Tsm, respectively. One-frame period also has a reverse bias voltage application period. In this embodiment mode, the subframe periods SF1, SF2, and SF3, and the reverse bias voltage application period (FRB) are provided in one-frame period as shown in FIG. 8A. During each subframe period, the writing periods Ta1 to Ta3 are sequentially performed followed by the display periods Ts1 to Ts3, respectively.

Figure 8B:
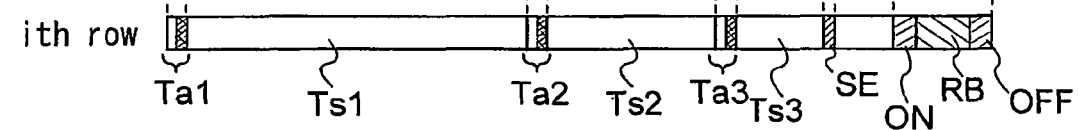

A timing chart illustrated in FIG. 8B shows a writing period, a display period, and a reverse bias voltage application period of a certain row (i-th row). The reverse bias voltage application period appears after the writing period and the display period appear alternately. A period which has the writing period and the display period is a forward bias voltage application period.

A writing period Ta is divided into a plurality of operation periods. In this embodiment mode, the writing period is divided into two periods. An erasing operation is performed during one of the two periods. While, a writing operation is performed during the other one of the two periods. To thus provide the erasing period and the writing period, a WE (Write Erase) signal is inputted. Other erasing operation, writing operation, and a signal are described in detail in the following embodiment mode.

Immediately before the reverse bias voltage application period, a period in which switching transistors of all pixels are turned on at the same time, that is, a period (on-period) in which all scanning lines are turned on is provided.

Immediately after the reverse bias voltage application period, a period in which switching transistors of all pixels are turned off at the same time, that is, a period (off-period) in which all scanning lines are turned off is provided.

Immediately before the reverse bias voltage application period, an erasing period (SE) is also provided. The operation in the erasing period can be performed in the same manner as the aforementioned erasing operation. In the erasing period, data which has been written in the subframe period immediately before the erasing period, in this embodiment mode, SF3, is sequentially erased. This is because in the on-period, after the display period of pixels of the last row is finished, the switching transistors are turned on all at once so that pixels of the first row and the like have an unnecessary display period.

Such operations in the on-period, the off-period, and the erasing period are performed by a driving circuit such as a scanning line driving circuit and a signal line driving circuit.

Note that the timing at which a reverse bias voltage is applied to the light emitting element 13, in other words, the reverse bias voltage application period, is not limited to the one shown in FIGS. 8A and 8B. That is to say, the reverse bias voltage application period is not necessarily provided in each frame period nor the latter half of one frame period. Further, the on-period is only required to be provided immediately before an applying period (RB), while the off-period is only required to be provided immediately after the applying period (RB). The order of reversing the anode potential and the cathode potential of the light emitting element is not limited to the one shown in FIGS. 8A and 8B. That is, the anode potential may be decreased after the cathode potential is increased.

Figure 3:
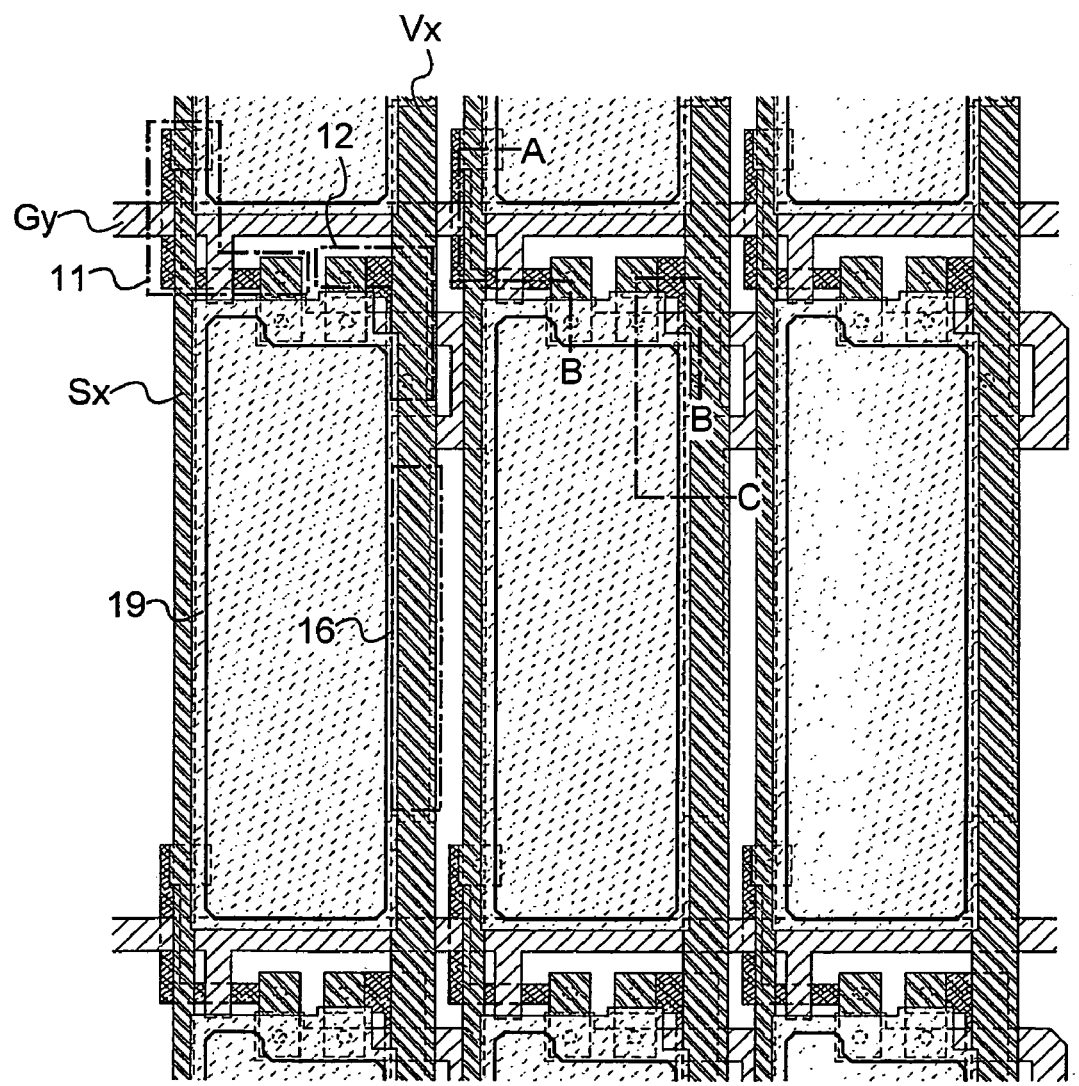
FIG. 3 is a view showing a layout of a pixel of the invention.

A layout example of the pixel circuit shown in FIG. 2 is illustrated in FIG. 3. A semiconductor film which constitutes the switching transistor 11 and the driving transistor 12 is provided. Thereafter, a first conductive film is provided with an insulating film which functions as a gate insulating film interposed therebetween. The first conductive film can be used as gate electrodes of the switching transistor 11 and the driving transistor 12, and a scanning line Gy. At this time, the switching transistor 11 may have a double-gate structure.

Thereafter, a second conductive film is formed with an insulating film which functions as an interlayer insulating film interposed therebetween. The second conductive film can be used as a drain wiring and a source wiring of the switching transistor 11 and the driving transistor 12, and as the signal line Sx and the power source line Vx. At this time, the capacitor 16 can be formed by stacking the first conductive film, the insulating film which functions as an interlayer insulating film, and the second conductive film. The gate electrode of the driving transistor 12 and the other electrode of the switching transistor 11 are connected through a contact hole.

A pixel electrode 19 is formed in an opening which is provided in a pixel. The pixel electrode 19 is connected to the other electrode of the driving transistor 12. At this time, in the case where an insulating film and the like is provided between the second conductive film and the pixel electrode, the pixel electrode is required to be connected to the other electrode of the driving transistor through a contact hole. In the case where an insulating film and the like is not provided, the other electrode of the driving transistor 12 can be directly connected to the pixel electrode.

In the layout shown in FIG. 3, the first conductive film and the pixel electrode may overlap each other to achieve a high aperture ratio. In such a region, a coupling capacitance may be generated, which is unwanted capacitance. The unwanted capacitance can be eliminated by the driving method of the invention.

Figure 4:
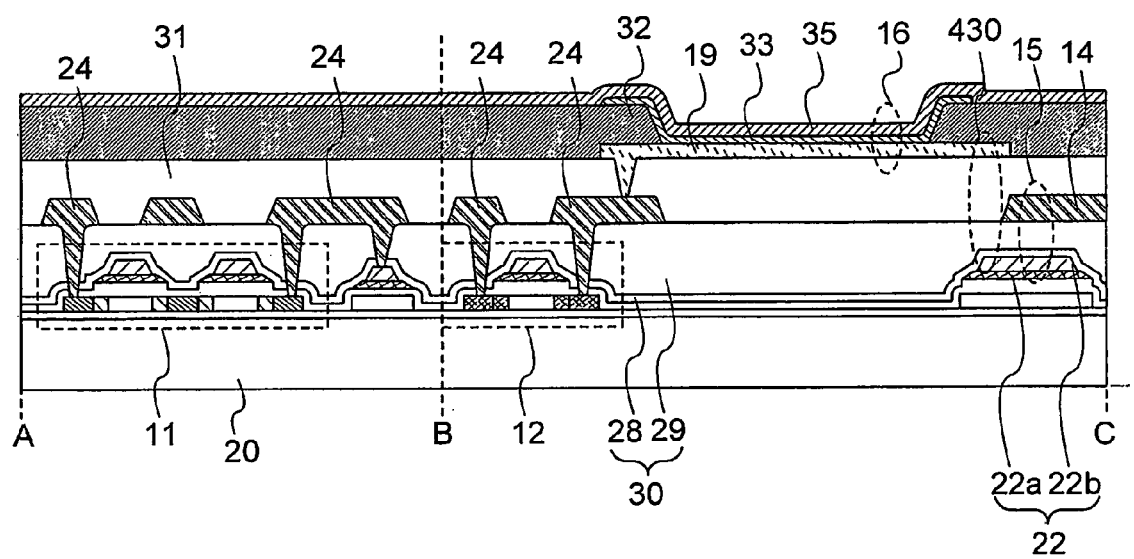
FIG. 4 is a view showing a cross section of a pixel of the invention.

FIG. 4 shows a cross-sectional-view example cutting along lines A-B and B-C of FIG. 3.

A patterned semiconductor film is formed over an insulating substrate 20 with a base film interposed therebetween. The insulating substrate 20 can be formed using, for example, a glass substrate such as a barium borosilicate glass and an aluminoborosilicate glass, a quartz substrate, a stainless (SUS) substrate and the like. Further, a substrate which is formed of synthetic resin having flexibility such as plastic typified by PET (polyethylene terephthalate), PEN (polyethylene naphthalate) and PES (polyether sulfone) and acrylic generally tends to have a lower heat resistance temperature compared with other substrates. However, such a substrate can be used if it can withstand a processing temperature in manufacturing steps. The base film can be formed by using an insulating film such as silicon oxide, silicon nitride, and silicon nitride oxide.

An amorphous semiconductor film is formed over the base film. The film thickness of the amorphous semiconductor film is 25 to 100 nm (preferably 30 to 60 nm). Further, silicon germanium as well as silicon can be used as the amorphous semiconductor film.

Next, the amorphous semiconductor film is crystallized if necessary to form a crystalline semiconductor film. Crystallization can be performed by using a furnace, laser irradiation, or light irradiation from a lamp (hereinafter referred to as lamp anneal), or a combination thereof. For example, the amorphous semiconductor film is doped with a metal element, and subjected to heat treatment by using the furnace, thereby forming a crystalline semiconductor film. Thus, it is preferable to dope the film with the metal element since the film can be crystallized at low temperature.

The crystalline semiconductor film formed in this manner is patterned into a predetermined shape. The predetermined shape is a shape to be the switching transistor 11 and the driving transistor 12 as shown in FIG. 3.

Next, an insulating film is formed, which functions as a gate insulating film. The insulating film is formed to cover the semiconductor film and have a thickness of 10 to 150 nm, and preferably 20 to 40 nm. For example, a silicon oxynitride film, a silicon oxide film and the like can be used and a monolayer structure or a stacked structure may be adopted.

A first conductive film which functions as a gate electrode is formed with the gate insulating film interposed therebetween. The gate electrode may have a monolayer structure or a stacked structure, though in this embodiment mode, a stacked structure of conductive films 22a and 22b is used. Each of the conductive films 22a and 22b may be formed of an element selected from Ta, W, Ti, Mo, Al, and Cu, or an alloy material or a compound material which mainly contains the aforementioned elements. In this embodiment mode, a tantalum nitride film with a thickness of 10 to 50 nm, for example, 30 nm is formed as the conductive film 22a, and a tungsten film with a thickness of 200 to 400 nm, for example, 370 nm is formed thereon as the conductive film 22b.

An impurity element is doped by using the gate electrode as a mask. At this time, in addition to a high-concentration impurity region, a low-concentration impurity region may be formed, which is referred to as an LDD (Lightly Doped Drain) structure. Specifically, a structure in which the low-concentration impurity region overlaps the gate electrode is referred to as a GOLD (Gate-drain Overlapped LDD) structure. Specifically, an N-channel transistor may adopt a configuration including the low-concentration impurity region.

The low-concentration impurity region may cause unwanted capacitance. Therefore, in the case where a pixel is constituted by a TFT which has the LDD structure or the GOLD structure, it is preferable to use the driving method of the invention.

Thereafter, insulating films 28 and 29 which function as an interlayer insulating film 30 are provided. The insulating film 28 may be an insulating film containing nitrogen, and in this embodiment mode, a silicon nitride film with a thickness of 100 nm is formed by a plasma CVD method. The insulating film 29 can be formed by using an organic material or an inorganic material. An organic material includes polyimide, acrylic, polyamide, polyimide amide, resist, benzocyclobutene, siloxane, or polysilazane. Note that siloxane is a resin which includes a Si—O—Si bond. Siloxane is composed of a skeleton formed by the bond of silicon (Si) and oxygen (O), in which an organic group containing at least hydrogen (such as an alkyl group or aromatic hydrocarbon) is included as a substituent. Alternatively, a fluoro group may be used as the substituent. Further alternatively, a fluoro group and an organic group containing at least hydrogen may be used as the substituent. Polysilazane is formed using as a starting material a liquid material containing a polymer material having the bond of silicon (Si) and nitrogen (N). An insulating film containing oxygen or nitrogen such as silicon oxide ($SiO_x$), silicon nitride ($SiN_x$), silicon oxynitride ($SiO_xN_y$) (x>y), and silicon nitride oxide ($SiN_xO_y$) (x>y) (x, y=1, 2 . . . ) can be used as an inorganic material. Further, the stacked structure of these insulating films may be used as the insulating film 28. Specifically, in the case where a second interlayer insulating film is formed using an organic material, planarity increases, while moisture and oxygen are absorbed into the organic material. To prevent the absorption of moisture and oxygen, an insulating film which has an inorganic material may be provided over the organic material. An insulating film containing nitrogen is preferably used as the inorganic material since alkali ions such as Na can be prevented from entering. An organic material is preferably used for the insulating film 29 since planarity can be improved.

A contact hole is formed in the interlayer insulating film 30. Thus, a second conductive film is formed, which functions as source and drain wirings 24 of the switching transistor 11 and the driving transistor 12, the signal line Sx, and the power source line Vx. The second conductive film can be formed using a film containing an element such as aluminum (Al), titanium (Ti), molybdenum (Mo), tungsten (W), or silicon (Si), or an alloy film containing these elements. In this embodiment mode, the second conductive film is formed by stacking a titanium (Ti) film, a titanium nitride (TiN) film, an aluminum-silicon (Al—Si) alloy film, and a titanium (Ti) film so as to have a thickness of 60 nm, 40 nm, 300 nm, and 100 nm respectively.

Thereafter, an insulating film 31 is provided to cover the second conductive film. The insulating film 31 can be formed using any of the materials of the interlayer insulating film 30 described above. A high aperture ratio can be achieved by providing such an insulating film 31.

A pixel electrode (also referred to as a first electrode) 19 is formed in the opening which is provided in the insulating film 31. The edge of the opening is preferably roundish so as to have a plurality of curvature radii in order to increase the step coverage of the pixel electrode in the opening. The pixel electrode 19 may be formed using a light transmissive material such as ITO (Indium Tin Oxide), IZO (Indium Zinc Oxide) in which zinc oxide (ZnO) of 2 to 20% is mixed into indium oxide, ITO—$SiO_x$ (referred to as ITSO or NITO for convenience) in which silicon oxide ($SiO_2$) of 2 to 20% is mixed into indium oxide, organic indium, and organic tin. The pixel electrode 19 may also be formed using a non-light transmissive material such as tantalum, tungsten, titanium, molybdenum, aluminum, and copper as well as silver (Ag) or an alloy material or a compound material which mainly contains the aforementioned elements. At this time, in the case where the insulating film 31 is formed using an organic material to increase planarity, the surface planarity on which the pixel electrode is formed increases, so that a constant voltage can be applied and a short-circuit can be prevented.

Coupling capacitance may be generated in the region 430 in which the first conductive film overlaps the pixel electrode. The coupling capacitance is unwanted capacitance. Such unwanted capacitance can be eliminated by the driving method of the invention.

Thereafter, an electroluminescent layer 33 is formed by a vapor deposition method or an inkjet method. The electroluminescent layer 33 has an organic material or an inorganic material, and is constituted by arbitrarily combining an electron injection layer (EIL), an electron transporting layer (ETL), a light emitting layer (EML), a hole transporting layer (HTL), a hole injection layer (HIL) and the like. Note that the boundaries between each layer are not necessarily clearly defined, and there is also a case where materials of the respective layers are partially mixed with each other, which blurs the boundaries. Further, the structure of the electroluminescent layer is not limited to the aforementioned stacked structure.

A second electrode 35 is formed by a sputtering method or a vapor deposition method. The first electrode (pixel electrode) 19 and the second electrode 35 of the electroluminescent layer (light emitting element) function as an anode or a cathode depending on a pixel configuration.

The anode is preferably formed using a metal, an alloy, a conductive compound, and a mixture thereof which have a high work function (work function of 4.0 eV or more). More specifically, it is possible to use gold (Au), platinum (Pt), Nickel (Ni), tungsten (W), chromium (Cr), molybdenum (Mo), iron (Fe), cobalt (Co), copper (Cu), and palladium (Pd), or nitride (TiN) of metal material and the like as well as ITO and IZO in which zinc oxide (ZnO) of 2 to 20% is mixed in indium oxide.

On the other hand, the cathode is preferably formed using a metal, an alloy, a conductive compound, and a mixture thereof which have a low work function (work function of 3.8 eV or less). More specifically, it is possible to use an element which belongs to Group 1 or Group 2 of the Periodic Table of the Elements, that is to say, an alkaline metal such as Li and Cs, an alkaline-earth metal such as Mg, Ca, and Sr, an alloy (Mg:Ag, Al:Li) or a compound (LiF, CsF, $CaF_2$) containing these metals, and a transition metal which includes a rare-earth metal. Note that since the cathode is required to transmit light, these metals or alloys containing them are formed extremely thin and stacked with a metal (including an alloy) such as ITO.

Then, a protective film may be formed so as to cover the second electrode 35. As the protective film, a silicon nitride film or a DLC film can be used.

In this manner, the pixel of the light emitting device can be completed.

Embodiment Mode 5

Described in this embodiment mode is a configuration of the whole panel which has the pixel circuit shown in the aforementioned embodiment mode.

Figure 12:
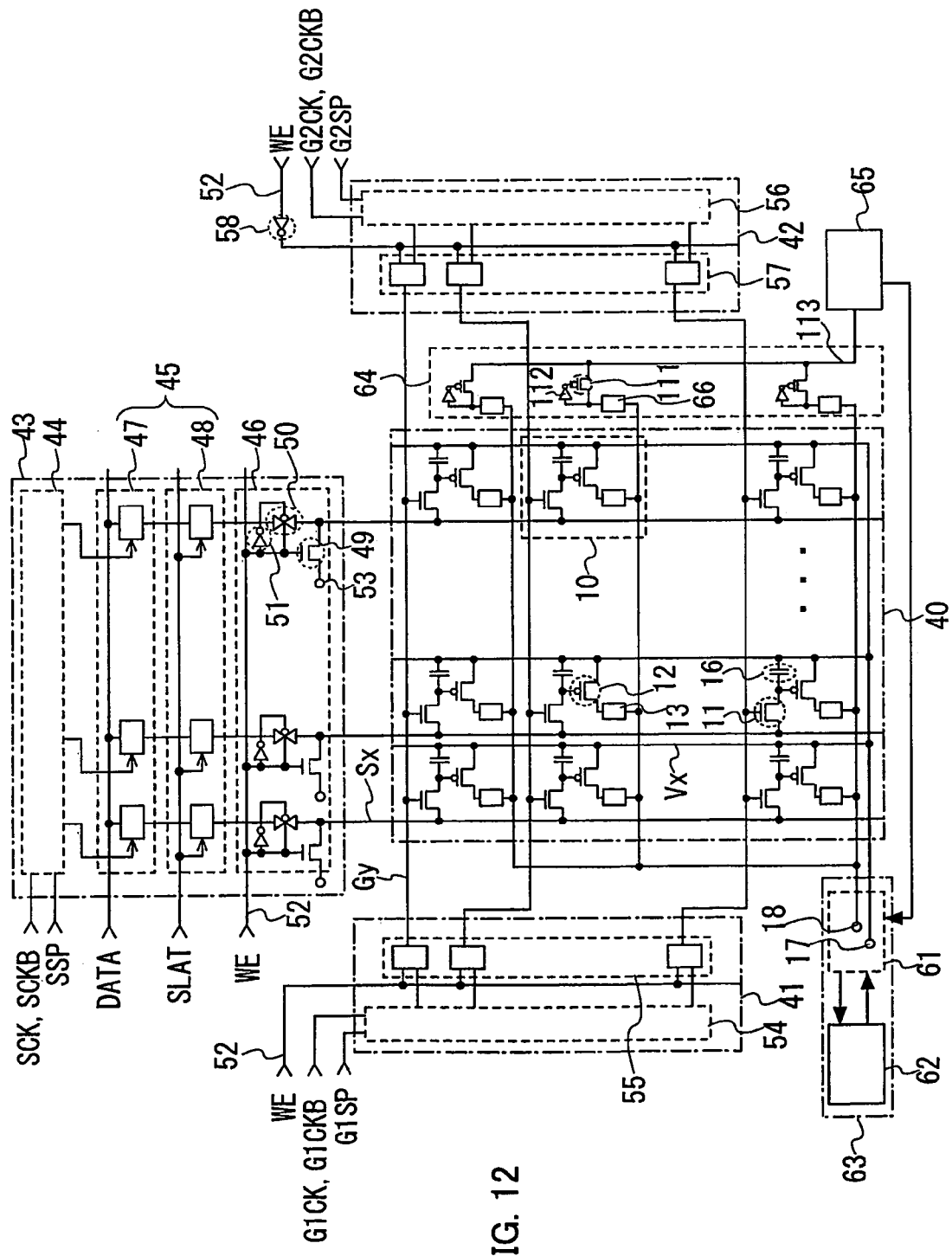
FIG. 12 is a view showing a panel of the invention.

As shown in FIG. 12, the light emitting device of the invention has the pixel portion 40 in which the aforementioned plurality of pixels 10 are arranged in matrix, the first scanning line driving circuit 41, the second scanning line driving circuit 42, and the signal line driving circuit 43. The first scanning line driving circuit 41 and the second scanning line driving circuit 42 may be arranged to face each other across the pixel portion 40, or arranged on any one of the four sides: left, right, top, and bottom of the pixel portion 40.

The signal line driving circuit 43 has a pulse output circuit 44, a latch 45, and a selection circuit 46. The latch 45 has a first latch 47 and a second latch 48. The selection circuit 46 has a transistor 49 (hereinafter referred to as a TFT 49) and an analog switch 50 as switching means. The TFT 49 and the analog switch 50 are provided in each column depending on a signal line. In addition, in this embodiment mode, an inverter 51 is provided in each column to generate an inverted signal of a WE signal. Note that the inverter 51 is not necessarily provided in the case where the inverted signal of the WE signal is supplied externally.

A gate electrode of the TFT 49 is connected to a selection signal line 52, and one electrode thereof is connected to a signal line while the other electrode is connected to a power source 53. The analog switch 50 is provided between the second latch 48 and each signal line. In other words, an input terminal of the analog switch 50 is connected to the second latch 48, while an output terminal is connected to a signal line. The analog switch 50 has two control terminals, one of which is connected to the selection signal line 52, while the other is connected to the selection signal line 52 through the inverter 51. The power source 53 has a potential which turns off the driving transistor 12 in each pixel, and the potential of the power source 53 is at Low in the case where the driving transistor 12 has N-channel conductivity, while the potential of the power source 53 is at High in the case where the driving transistor 12 has P-channel conductivity.

The first scanning line driving circuit 41 has a pulse output circuit 54 and a selection circuit 55. The second scanning line driving circuit 42 has a pulse output circuit 56 and a selection circuit 57. Start pulses (G1SP, G2SP) are inputted to the pulse output circuits 54 and 56, respectively. Further, clock pulses (G1CK, G2CK) and inverted clock pulses (G1CKB, G2CKB) thereof are inputted to the pulse output circuits 54 and 56, respectively.

The selection circuits 55 and 57 are connected to the selection signal line 52. Note that the selection circuit 57 included in the second scanning line driving circuit 42 is connected to the selection signal line 52 through an inverter 58. That is to say, WE signals which are inputted to the selection circuits 55 and 57 through the selection signal line 52 are inverted from each other.

Each of the selection circuits 55 and 57 has a tri-state buffer. The tri-state buffer is brought into an operation state in the case where a signal inputted from the selection signal line 52 is at H level, while the tri-state buffer is brought into a high impedance state in the case where the signal is at L level.

Each of the pulse output circuit 44 included in the signal line driving circuit 43, the pulse output circuit 54 included in the first scanning line driving circuit 41, and the pulse output circuit 56 included in the second scanning line driving circuit 42 has a shift register including a plurality of flip-flop circuits or a decoder circuit. When a decoder circuit is used as the pulse output circuits 44, 54, and 56, a signal line or a scanning line can be selected at random, which can prevent pseudo-contour from occurring in the case where a time gray scale method is adopted.

Note that the configuration of the signal line driving circuit 43 is not limited to the aforementioned one, and a level shifter or a buffer may be provided additionally. The configurations of the first scanning line driving circuit 41 and the second scanning line driving circuit 42 are also not limited to the aforementioned one, and a level shifter or a buffer may be provided additionally. Further, each of the signal line driving circuit 43, the first scanning line driving circuit 41, and the second scanning line driving circuit 42 may have a protection circuit.

In the invention, a protection circuit may be provided. The protection circuit may include a plurality of resistor elements. For example, a P-channel transistor can be used as the plurality of resistor elements. The protection circuit can be provided in each of the signal line driving circuit 43, the first scanning line driving circuit 41, and the second scanning line driving circuit 42. The protection circuit is preferably provided between the pixel portion 40 and the signal line driving circuit 43, the first scanning line driving circuit 41, or the second scanning line driving circuit 42. Such a protection circuit prevents degradation or destruction of elements due to static electricity.

In this embodiment mode, the light emitting device has a power source control circuit 63. The power source control circuit 63 has a power source circuit 61 which supplies power to the light emitting element 13 and a controller 62. The power source circuit 61 has a first power source 17 which is connected to a pixel electrode of the light emitting element 13 through the driving transistor 12 and the power source line Vx. The power source circuit 61 also has a second power source 18 which is connected to the light emitting element 13 through the power source line connected to an opposite electrode.

In such a power source circuit 61, when a forward bias voltage is applied to the light emitting element 13 so that the light emitting element 13 is supplied with a current and emits light, a potential of the first power source 17 is set to be higher than a potential of the second power source 18. On the other hand, when a reverse bias voltage is applied to the light emitting element 13, the potential of the first power source 17 is set to be lower than the potential of the second power source 18. Such a setting of the power source can be performed by supplying a predetermined signal from the controller 62 to the power source circuit 61.

In this embodiment mode, the light emitting device has the monitoring circuit 64 and a control circuit 65. The control circuit 65 has the constant current source and the buffer amplifier circuit. The monitoring circuit 64 has the monitoring light emitting element 66, the monitor controlling transistor 111, and the inverter 112.

The control circuit 65 supplies to the power source control circuit 63a signal which corrects a power source potential based on an output of the monitoring circuit 64. The power source control circuit 63 corrects a power source potential to be supplied to the pixel portion 40 based on a signal which is supplied from the control circuit 65.

In the light emitting device of the invention which has the aforementioned configuration, variation in a current value due to a change of ambient temperature and degradation with time can be suppressed, leading to improved reliability. Further, the monitor controlling transistor 111 and the inverter 112 prevents a current from the constant current source 105 from flowing to the monitoring light emitting element 66 which is short-circuited, so that variations in a current value can be supplied to the light emitting element 13 accurately.

Embodiment Mode 6

In this embodiment mode, an operation of the light emitting device of the invention which has the aforementioned configuration is described with reference to drawings.

Figure 14A:
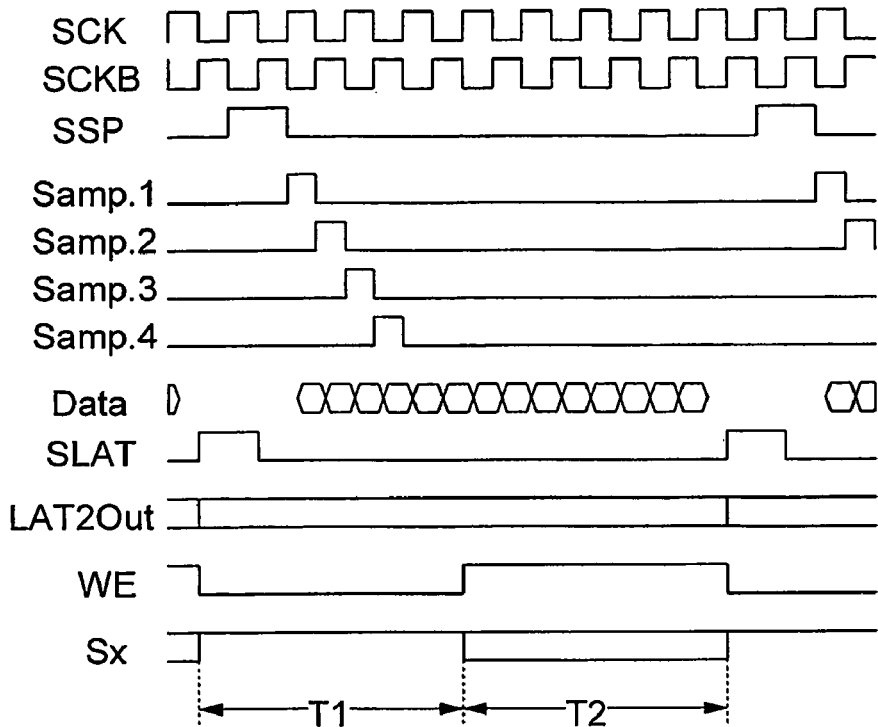
FIGS. 14A and 14B are views each showing a timing chart of the invention.

First, an operation of the signal line driving circuit 43 is described with reference to FIG. 14A. A clock signal (hereinafter referred to as SCK), a clock inverted signal (hereinafter referred to as SCKB), and a start pulse (hereinafter referred to as SSP) are inputted to the pulse output circuit 44, and in accordance with the timing of these signals, a sampling pulse is outputted to the first latch 47. The first latch 47 to which data is inputted holds video signals from the first column to the last column in accordance with the timing of the sampling pulse. The video signals held in the first latch 47 are transferred to the second latch 48 at a time when a latch pulse is inputted.

Herein, an operation of the selection circuit 46 during each period is described, on the assumption that a WE signal transmitted from the selection signal line 52 is at L level during a period T1 while at H level during a period T2. Each of the periods T1 and T2 corresponds to half of a horizontal scanning period, and the period T1 refers to as a first subgate selection period while the period T2 refers to as a second subgate selection period.

During the period T1 (the first subgate selection period), the WE signal transmitted from the selection signal line 52 is at L level, the transistor 49 is in an on-state, and the analog switch 50 is in a non-conductive state. Then, a plurality of signal lines S1 to Sn are electrically connected to the power source 53 through the transistor 49 which is arranged in each column. In other words, a plurality of signal lines Sx have the same potential as the power source 53. At this time, the switching transistor 11 in the selected pixel 10 is turned on so that the potential of the power source 53 is transmitted to the gate electrode of the driving transistor 12 through the switching transistor 11. Then, the driving transistor 12 is in an off-state so that no current flows between both electrodes of the light emitting element 13 and no light is emitted. Thus, independently of a state of a video signal which is inputted to the signal line Sx, the potential of the power source 53 is transmitted to the gate electrode of the driving transistor 12 so that the switching transistor 11 is brought into an off-state, and light emission of the light emitting element 13 is forcibly stopped, which is an erasing operation.

During the period T2 (the second subgate selection period), the WE signal transmitted from the selection signal line 52 is at H level, the transistor 49 is in an off-state, and the analog switch 50 is in a conductive state. Then, video signals of one row which are held in the second latch 48 are transmitted to each signal line Sx at a time. At this time, the switching transistor 11 in the pixel 10 is turned on, and a video signal is transmitted to the gate electrode of the driving transistor 12 through the switching transistor 11. In accordance with the inputted video signal, the driving transistor 12 is turned on or off, and the first electrode and the second electrode of the light emitting element 13 have different potentials or the same potential. More specifically, when the driving transistor 12 is turned on, the first electrode and the second electrode of the light emitting element 13 have different potentials so that a current flows to the light emitting element 13, and light is emitted. Note that the current flowing to the light emitting element 13 is the same as the current flowing between the source and drain of the driving transistor 12.

On the other hand, when the driving transistor 12 is turned off, the first electrode and the second electrode of the light emitting element 13 have the same potential, and no current flows to the light emitting element 13. That is to say, the light emitting element 13 emits no light In this manner, in accordance with a video signal, the driving transistor 12 is brought into an on-state or an off-state, and the first electrode and the second electrode of the light emitting element 13 have different potentials or the same potential, which is a writing operation.

Figure 14B:
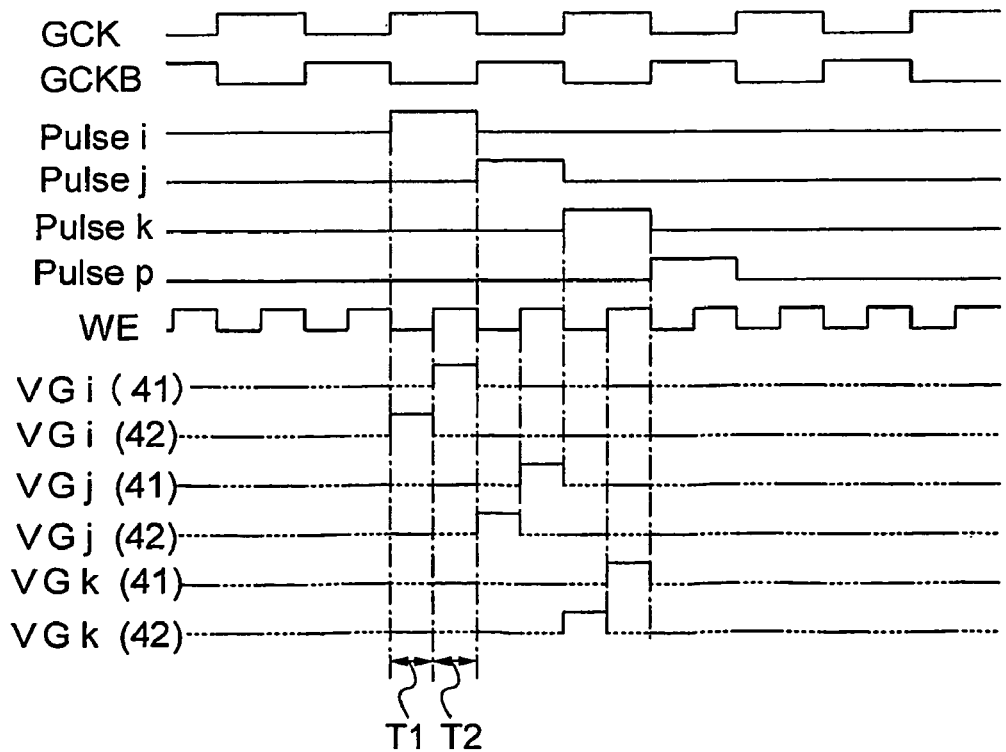

Next, the operation of the first scanning line driving circuit 41 and the second scanning line driving circuit 42 is described. G1CK, G1CKB, and G1SP are inputted to the pulse output circuit 54, and in accordance with the timing of these signals, pulses are outputted to the selection circuit 55 sequentially. Meanwhile, G2CK, G2CKB, and G2SP are inputted to the pulse output circuit 56, in accordance with the timing of these signals, pulses are outputted to the selection circuit 57 sequentially. Potentials of the pulses which are supplied to the selection circuits 55 and 57 of each of the i-th row, the j-th row, the k-th row, and the p-th row (i, j, k, and p are natural numbers, $1 \leq i, j, k,$ and $p \leq n$) are shown in FIG. 14B.

Herein, described are operations of the selection circuit 55 included in the first scanning line driving circuit 41 and the selection circuit 57 included in the second scanning line driving circuit 42 during each period, on the assumption that a WE signal transmitted from the selection signal line 52 is at L level during a period T1, while the WE signal is at H level during a period T2 similarly to the description of the signal line driving circuit 43. Note that in a timing chart of FIG. 14B, a potential of the gate line Gy (y is a natural number, $1 \leq y \leq n$) to which a signal is transmitted from the first scanning line driving circuit 41 is described as VGy (41), while a potential of the gate line to which a signal is transmitted from the second scanning line driving circuit 42 is described as VGy (42). VGy (41) and VGy (42) can be supplied by the same scanning line Gy.

During the period T1 (the first subgate selection period), the WE signal transmitted from the selection signal line 52 is at L level. Then, an L level WE signal is inputted to the selection circuit 55 included in the first scanning line driving circuit 41, and the selection circuit 55 is brought into a floating state. On the other hand, an inverted WE signal, namely an H level signal is inputted to the selection circuit 57 included in the second scanning line driving circuit 42 so that the selection circuit 57 is brought into an operation state. That is to say, the selection circuit 57 transmits an H level signal (row selection signal) to a gate line Gi of the i-th row so that the gate line Gi has the same potential as that of the H level signal. In other words, the gate line Gi of the i-th row is selected by the second scanning line driving circuit 42. As a result, the switching transistor 11 in the pixel 10 is in an on-state. A potential of the power source 53 included in the signal line driving circuit 43 is transmitted to the gate electrode of the driving transistor 12 so that the driving transistor 12 is in an off-state and the potentials of the two electrodes of the light emitting element 13 are made equal to each other. That is to say, during the period T1, the erasing operation in which the light emitting element 13 emits no light is performed.

During the period T2 (the second subgate selection period), the WE signal transmitted from the selection signal line 52 is at H level. Then, an H level WE signal is inputted to the selection circuit 55 included in the first scanning line driving circuit 41 so that the selection circuit 55 is in an operation state. In other words, the selection circuit 55 transmits an H level signal to the gate line Gi of the i-th row so that the gate line Gi has the same potential as that of the H level signal. That is to say, the gate line Gi of the i-th row is selected by the first scanning line driving circuit 41. As a result, the switching transistor 11 in the pixel 10 is in an on-state. A video signal is transmitted from the second latch 48 included in the signal line driving circuit 43 to the gate electrode of the driving transistor 12 so that the driving transistor 12 is in an on-state or an off-state, and the two electrodes of the light emitting element 13 have different potentials or the same potential. In other words, during the period T2, the writing operation in which the light emitting element 13 emits light or no light is performed. On the other hand, an L level signal is inputted to the selection circuit 57 included in the second scanning line driving circuit 42, and the selection circuit 57 is brought into a floating state.

Thus, the gate line Gy is selected by the second scanning line driving circuit 42 during the period T1 (the first subgate selection period), while selected by the first scanning line driving circuit 41 during the period T2 (the second subgate selection period). That is to say, the gate line is controlled by the first scanning line driving circuit 41 and the second scanning line driving circuit 42 in a complementary manner. During one of the first subgate selection period and the second subgate selection period, the erasing operation is performed, and the writing operation is performed during the other.

Note that during the period in which the first scanning line driving circuit 41 selects the gate line Gi of the i-th row, the second scanning line driving circuit 42 does not operate (the selection circuit 57 is in a floating state), or transmits a row selection signal to gate lines of rows other than the i-th row. Similarly, during the period in which the second scanning line driving circuit 42 transmits the row selection signal to the gate line Gi of the i-th row, the first scanning line driving circuit 41 is in a floating state, or transmits the row selection signal to gate lines of rows other than the i-th row.

According to the invention performing the aforementioned operation, the light emitting element 13 can be forcibly turned off, which increases the duty ratio. Further, although the light emitting element 13 can be turned off forcibly, a TFT for discharging the charges of the capacitor 16 is not required to be provided, thereby a high aperture ratio is achieved. With the high aperture ratio, luminance of the light emitting element can be reduced with an increase in a light emitting area. That is to say, a driving voltage can be decreased to reduce power consumption.

Note that the invention is not limited to the aforementioned embodiment mode in which a gate selection period is divided into two. A gate selection period may be divided into three or more.

Embodiment Mode 7

Exemplified in this embodiment mode is a pixel configuration to which the driving method of the invention is applied. Note that the same configuration as that shown in FIG. 2 is not described.

Figure 9:
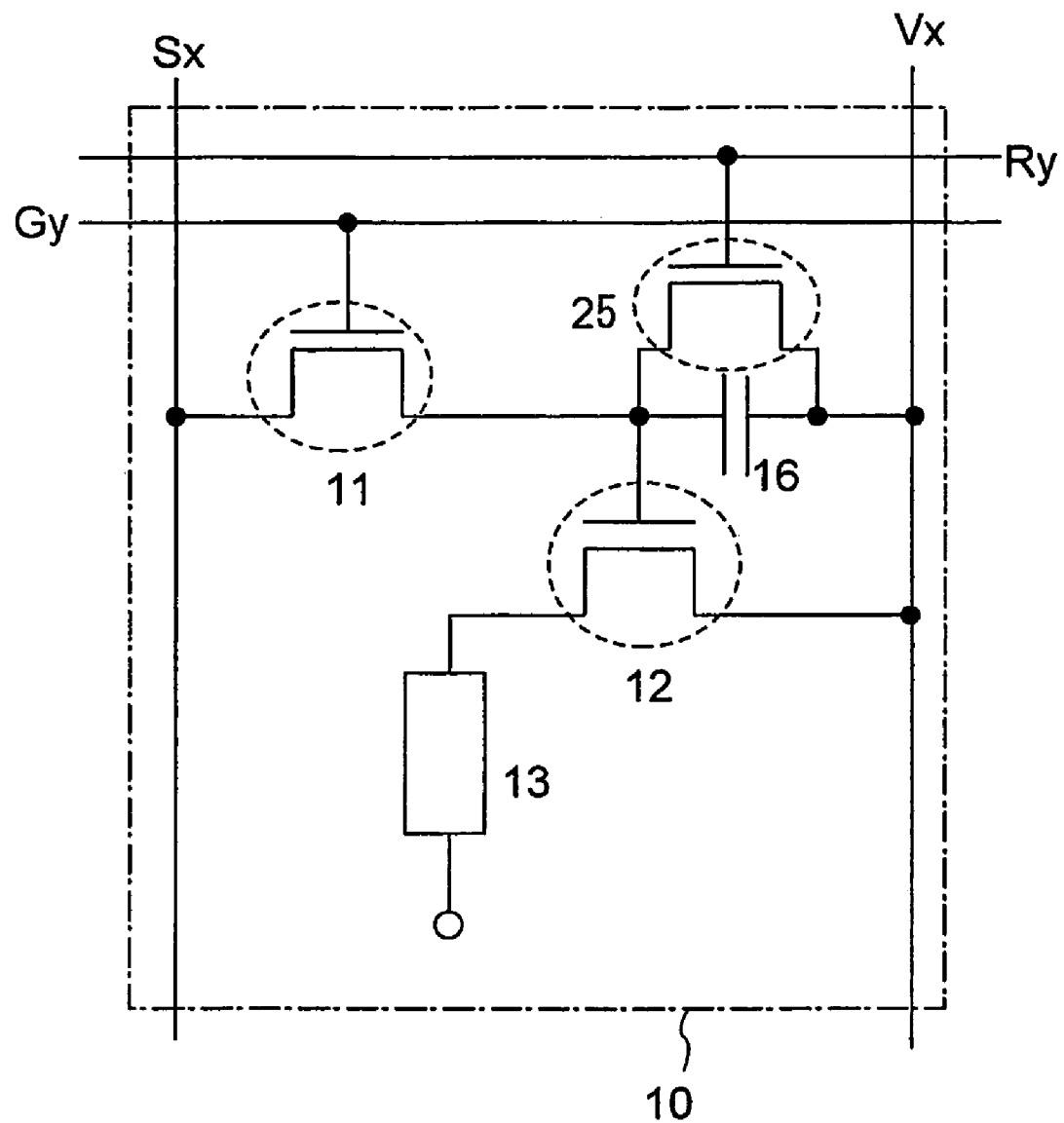
FIG. 9 is a view showing an equivalent circuit of a pixel of the invention.

FIG. 9 shows a pixel configuration in which a third transistor 25 is provided between two terminals of the capacitor 16 in addition to the pixel configuration shown in FIG. 2. The third transistor 25 has a function of discharging charges accumulated in the capacitor 16 during a predetermined period. The third transistor 25 is also referred to as an erasing transistor. The predetermined period is controlled by an erasing scanning line Ry to which a gate electrode of the third transistor 25 is connected.

For example, in the case where a plurality of subframe periods are provided, the charges in the capacitor 16 are discharged by the third-transistor 25 during a short subframe period. As a result, a duty ratio can be increased.

Figure 10A:
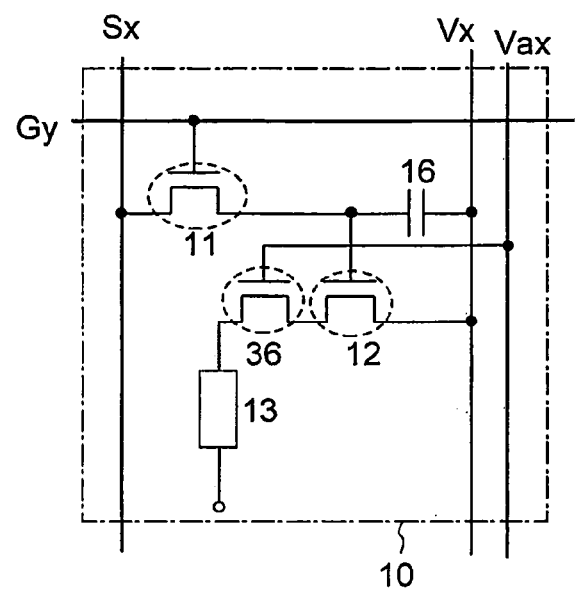
FIGS. 10A to 10C are views each showing an equivalent circuit of a pixel of the invention

FIG. 10A shows a pixel configuration in which a fourth transistor 36 is provided between the driving transistor 12 and the light emitting element 13 in addition to the pixel configuration shown in FIG. 2. A second power source line Vax with a fixed potential is connected to a gate electrode of the fourth transistor 36. Therefore, a current which is supplied to the light emitting element 13 can be constant independently of gate-source voltages of the driving transistor 12 and the fourth transistor 36. The fourth transistor 36 is also referred to as a current controlling transistor.

Figure 10B:
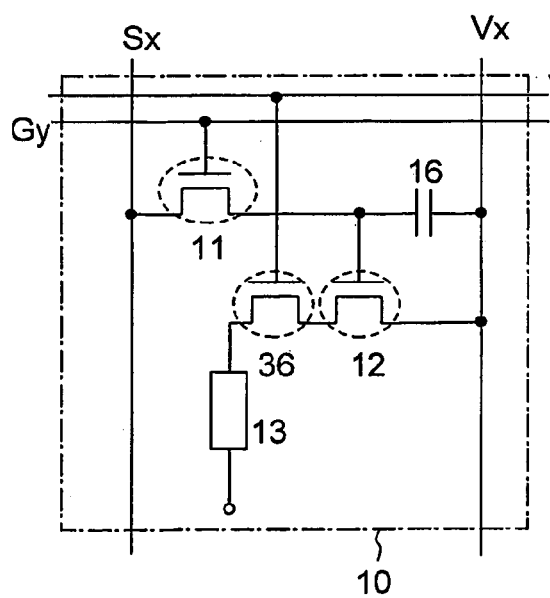

FIG. 10B shows a pixel configuration in which the second power source line Vax with a fixed potential is provided in parallel to the scanning line Gy, which differs from the configuration shown in FIG. 10A.

Figure 10C:
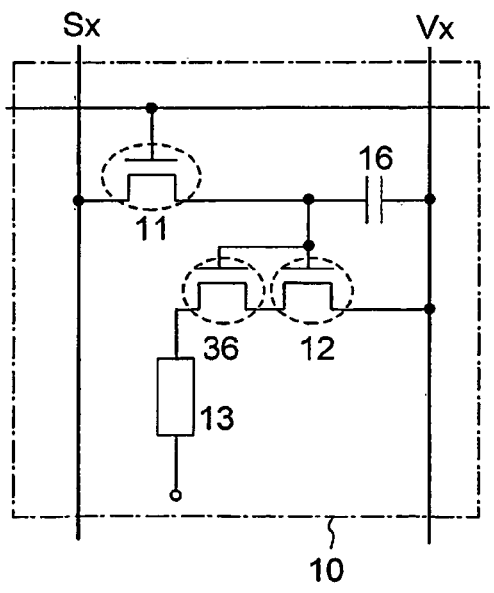

Further, FIG. 10C shows a pixel configuration in which the gate electrode of the fourth transistor 36 with a fixed potential is connected to the gate electrode of the driving transistor 12, which differs from the configurations shown in FIGS. 10A and 10B. In the pixel configuration which does not require a new power source line as shown in FIG. 10C, an aperture ratio can be maintained.

Figure 11:
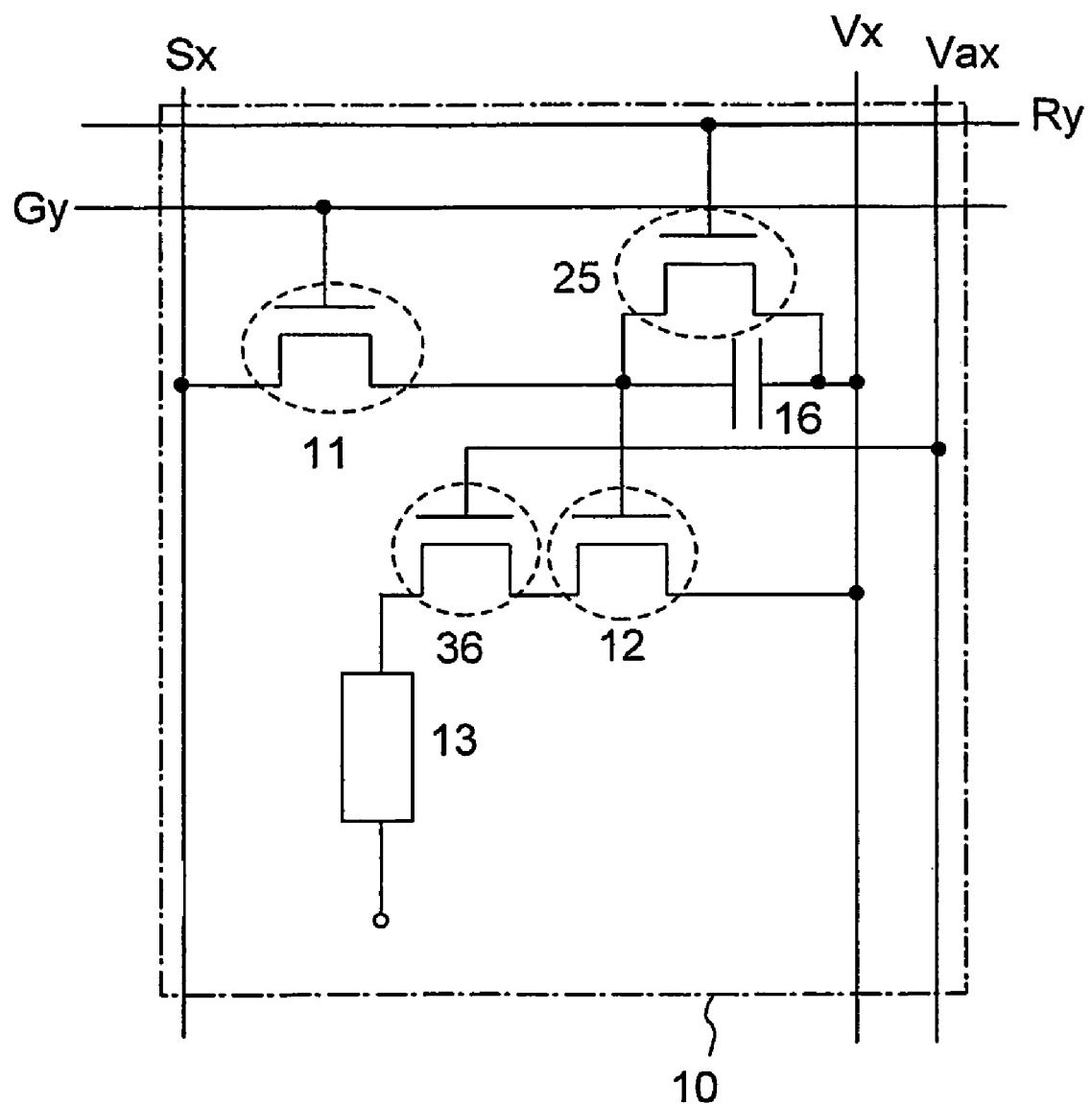
FIG. 11 is a view showing an equivalent circuit of a pixel of the invention

FIG. 11 shows a pixel configuration in which the erasing transistor shown in FIG. 9 is provided in addition to the pixel configuration shown in FIG. 10A. The charges in the capacitor 16 can be discharged by the erasing transistor. It is needless to say that the erasing transistor can be provided in addition to the pixel configuration shown in FIG. 10B or 10C.

That is to say, the invention is not limited to the aforementioned configurations and can be applied to any configuration.

Embodiment Mode 8

The invention can be applied to a light emitting device driven with a constant current. Described in this embodiment mode is a case where a change with time is detected by the monitoring light emitting element, and a change with time of a light emitting element is compensated by correcting a video signal or a power source potential based on the detection result.

In this embodiment mode, a first monitoring light-emitting element and a second monitoring light emitting element are provided. A constant current is supplied from a first constant current source to the first monitoring light emitting element, while a constant current is supplied from a second constant current source to the second monitoring light emitting element. The current value supplied from the first constant current source is made different from that supplied from the second constant current source so that the total amount of current flowing to the first monitoring light emitting element is different from that flowing to the second monitoring light emitting element. Then, the changes with time of the first monitoring light emitting element and the second monitoring light emitting element progress at different rates.

The first monitoring light emitting element and the second monitoring light emitting element are connected to an arithmetic circuit which calculates a potential difference between the first monitoring light emitting element and the second monitoring light emitting element. A voltage value calculated by the arithmetic circuit is supplied to a video signal generating circuit. In the video signal generating circuit, based on the voltage value supplied from the arithmetic circuit, a video signal supplied to each pixel is corrected. The change with time of the light emitting element can be compensated according to the aforementioned configuration.

Note that a circuit such as a buffer amplifier circuit for preventing variations in potential may be provided between each monitoring light emitting element and each arithmetic circuit.

Note that in this embodiment mode, a pixel which has a configuration to perform a constant current drive may use, for example, a current mirror circuit and the like.

Embodiment Mode 9

The invention can be applied to a passive matrix light emitting device. The passive matrix light emitting device has a pixel portion which is formed over a substrate, a column signal line driving circuit which is arranged at the periphery of the pixel portion, a row signal line driving circuit, and a controller which controls the driving circuits. The pixel portion has column signal lines which are arranged in the column direction, row signal lines which are arranged in the row direction, and a plurality of light emitting elements which are arranged in matrix. The monitoring circuit 64 can be provided over the substrate on which the pixel portion is formed.

In the light emitting device of this embodiment mode, image data which is inputted to the column signal line driving circuit, or a voltage which is generated from a constant voltage source can be corrected by the monitoring circuit 64 in accordance with a temperature change and a change with time, and a light emitting device in which the effect of both the temperature change and the change with time is reduced can be provided.

Embodiment Mode 10

An electronic device which is provided with a pixel portion including a light emitting element includes: a television set (simply referred to as a TV, or a television receiver), a digital camera, a digital video camera, a mobile phone set (simply referred to as a cellular phone set, or a cellular phone), a portable information terminal such as PDA, a portable game machine, a monitor for a computer, a computer, a sound reproducing device such as a car audio set, an image reproducing device provided with a recording medium such as a home game machine, and the like. Specific examples thereof are described with reference to FIGS. 15A to 15F.

Figure 15A:
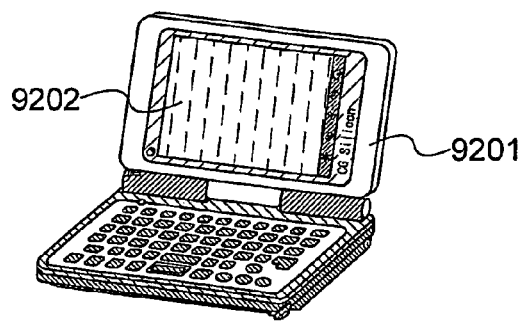
FIGS. 15A to 15F are views each showing an electronic device of the invention.

A portable information terminal shown in FIG. 15A includes a main body 9201, a display portion 9202 and the like. The light emitting device of the invention can be applied to the display portion 9202. That is to say, according to the invention in which the power source potential supplied to the light emitting element is corrected by the monitoring light emitting element, it is possible to provide a portable information terminal in which the effect of variations in a current value of the light emitting element due to a change of ambient temperature and a change with time is reduced.

Figure 15B:
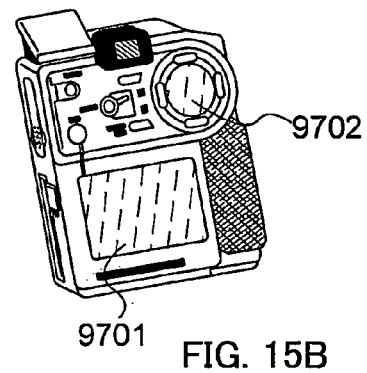

A digital video camera shown in FIG. 15B includes a display portion 9701, a display portion 9702 and the like. The light emitting device of the invention can be applied to the display portion 9701. According to the invention in which the power source potential supplied to the light emitting element is corrected by the monitoring light emitting element, it is possible to provide a digital video camera in which the effect of variations in a current value of the light emitting element due to a change of ambient temperature and a change with time is reduced.

Figure 15C:
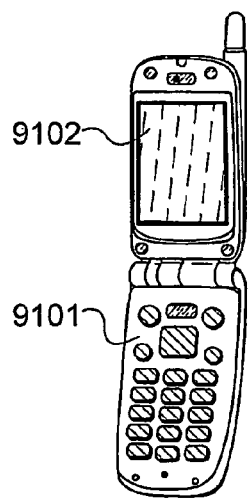

A cellular phone shown in FIG. 15C includes a main body 9101, a display portion 9102 and the like. The light emitting device of the invention can be applied to the display portion 9102. According to the invention in which the power source potential supplied to the light emitting element is corrected by the monitoring light emitting element, it is possible to provide a cellular phone in which the effect of variations in a current value of the light emitting element due to a change of ambient temperature and a change with time is reduced.

Figure 15D:
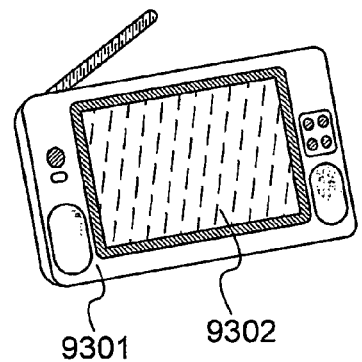

A portable television set shown in FIG. 15D includes a main body 9301, a display portion 9302 and the like. The light emitting device of the invention can be applied to the display portion 9302. According to the invention in which the power source potential supplied to the light emitting element is corrected by the monitoring light emitting element, it is possible to provide a portable television set in which the effect of variations in a current value of the light emitting element due to a change of ambient temperature and a change with time is reduced. The light emitting device of the invention can be applied to various types of television sets such as a small-sized television incorporated in a portable terminal such as a cellular phone, a medium-sized television which is portable, and a large-sized television (for example, 40 inches in size or more).

Figure 15E:
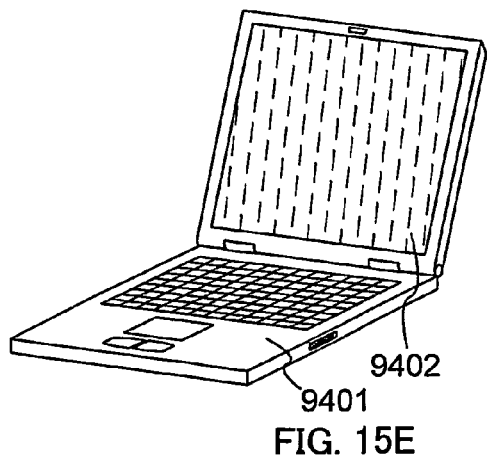

A portable computer shown in FIG. 15E includes a main body 9401, a display portion 9402 and the like. The light emitting device of the invention can be applied to the display portion 9402. According to the invention in which the power source potential supplied to the light emitting element is corrected by the monitoring light emitting element, it is possible to provide a portable computer in which the effect of variations in a current value of the light emitting element due to a change of ambient temperature and a change with time is reduced.

Figure 15F:
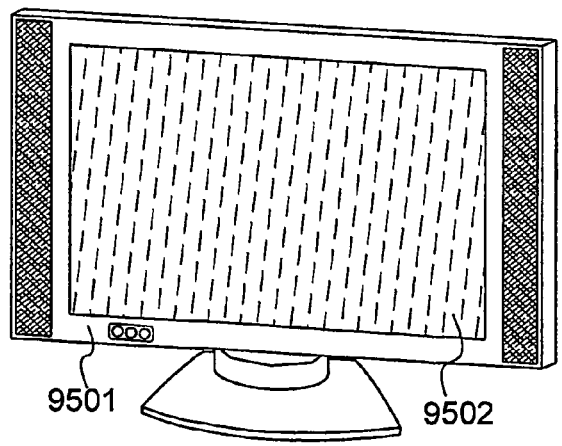

A television set shown in FIG. 15F includes a main body 9501, a display portion 9502 and the like. The light emitting device of the invention can be applied to the display portion 9502. According to the invention in which the power source potential supplied to the light emitting element is corrected by the monitoring light emitting element, it is possible to provide a television set in which the effect of variations in a current value of the light emitting element due to a change of ambient temperature and a change with time is reduced.

Embodiment Mode 11

Described in this embodiment mode is a configuration of a panel which can perform a full-color display, and has a monitoring light emitting element for each light emitting element which emits a different color light.

Figure 16:
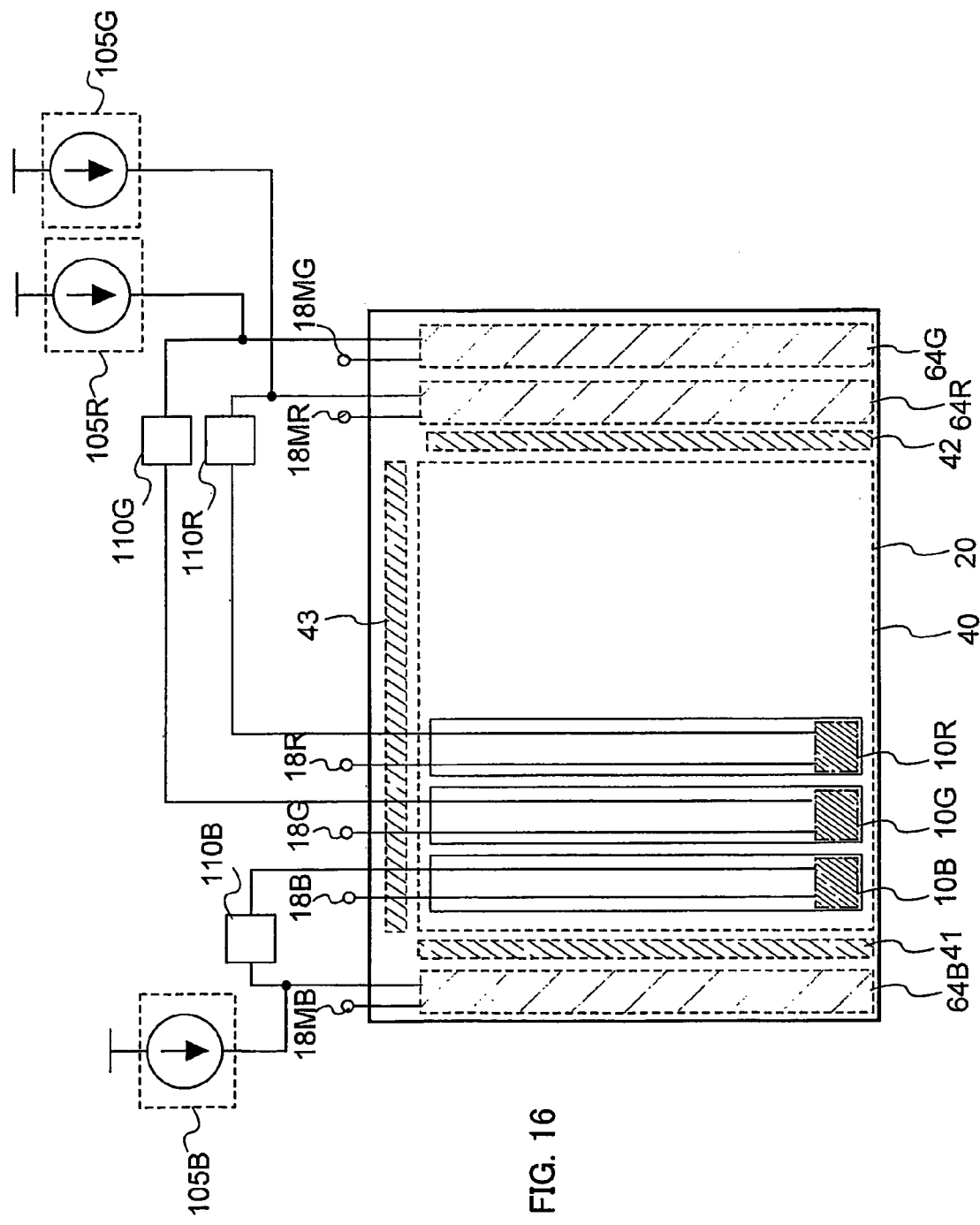
FIG. 16 is a view showing a light emitting device of the invention.

FIG. 16 shows a light emitting device in which the pixel portion 40, the signal line driving circuit 43, the first scanning line driving circuit 41, the second scanning line driving circuit 42, and monitoring circuits 64R, 64G, and 64B are provided over the insulating substrate 20. A light emitting element using a light emitting material which emits a different color light is provided in each pixel 10R, 10G, and 10B to perform a full-color display in the pixel 40. Each light emitting element is connected to respective power sources 18R, 18G, and 18B. Note that light emitting elements which emit the same color light are arranged in a stripe shape.

Buffer amplifier circuits 110R, 110G, and 110B are provided between the monitoring circuits 64R, 64G and 64B, and the pixels 10R, 10G and 10B, respectively. The operation of the buffer amplifier circuits can be performed by reference to Embodiment Mode 1.

The configuration of monitoring circuits 64R, 64G and 64B can be achieved by reference to Embodiment Mode 1. Specifically, each of the monitoring circuit, has a monitoring light emitting element including a light emitting material which emits each color light, a monitor controlling transistor connected to the monitoring light emitting element, and an inverter of which an output terminal is connected to a gate electrode of the monitor controlling transistor and an input terminal is connected to one electrode of the monitor controlling transistor and the monitoring light emitting element. Further, each monitoring light emitting element is connected to respective power sources 18MR, 18MG, and 18MB. Each monitor controlling transistor is connected to respective constant current sources 105R, 105G, and 105B through a monitor line. The monitor controlling transistor has a function of controlling current supply from the monitor line to each of the plurality of monitoring light emitting elements. The monitor line is connected to electrodes of the plurality of monitoring light emitting elements so that changes in the potentials of the electrodes can be monitored. Further, the constant current source has a function to supply a constant current to the monitor line.

In the light emitting device having such a configuration, even in the case where the light emitting elements which emit different color lights degrade at different rates, the degradation can be compensated by each monitoring light emitting element. That is to say, even when degradation progresses at different rates for each light emitting element material, the degradation can be compensated by providing the monitoring light emitting element for each light emitting element as shown in this embodiment mode. As a result, a light emitting device in which variations in luminance of each color light emitting element due to a change of ambient temperature and a change with time are reduced can be provided. Further, each of the monitoring circuits 64R, 64G and 64B of the invention preferably has the plurality of monitoring light emitting elements since the aforementioned variations in luminance can be corrected using the average value of these monitoring light emitting elements. Even if any one of the monitoring light emitting elements does not function due to a defect and the like, it can be replaced by the other monitoring light emitting elements.

Note that this embodiment mode describes a configuration in which light emitting elements which emit the same color light are arranged in a stripe shape, though the invention is not limited thereto. For example, in a pixel arranged in a delta shape, a monitoring light emitting element may be provided for a light emitting element which emits a different color light.

Further, in this embodiment mode, the monitoring circuit 64B for a blue light emitting element is provided on the left side of the pixel portion 40, while the monitoring circuit 64R for a red light emitting element and the monitoring circuit 64G for a green light emitting element are provided on the right side of the pixel portion 40, though the invention is not limited thereto. For example, monitoring circuits for all the light emitting elements may be provided on the left side of the pixel portion 40, or any one of the monitoring circuits may be provided on the upside or the downside of the pixel portion. Note that in view of the whole light emitting device, it is preferable that a region including a monitoring circuit is evenly dispersed.

The invention claimed is:

1. A light emitting device comprising:
a first light emitting element and a second light emitting element electrically connected to each other in parallel;
a first transistor having one of first source and first drain electrically connected to the first light emitting element;
a second transistor having one of second source and second drain electrically connected to the second light emitting element;
a first circuit configured to turn off the first transistor when the first light emitting element is short-circuited, and provided between a first gate of the first transistor and one of first source and first drain; and
a second circuit configured to turn off the second transistor when the second light emitting element is short-circuited, and provided between a second gate of the second transistor and one of second source and second drain.

2. The light emitting device according to claim 1, wherein each of the first circuit and the second circuit is inverter.

3. The light emitting device according to claim 1, wherein each of the first circuit and the second circuit comprises a P-channel first transistor, an N-channel second transistor electrically connected to the P-channel first transistor in parallel, and an N-channel third transistor electrically connected to the N-channel second transistor in series.

4. The light emitting device according to claim 1, wherein each of the first circuit and the second circuit comprises a P-channel first transistor, a P-channel second transistor electrically connected to the P-channel first transistor in series, an N-channel third transistor electrically connected to the P-channel second transistor in parallel, and an N-channel fourth transistor having a gate electrically connected to the gate of the P-channel first transistor.

5. The light emitting device according to claim 1, further comprising a buffer amplifier circuit electrically connected to the other one of first source and first drain and the other one of second source and second drain.

6. The light emitting device according to claim 1, wherein the first transistor and the second transistor have P-channel conductivity.

7. A light emitting device comprising:
a first light emitting element and a second light emitting element electrically connected to each other in parallel;
a first transistor having one of first source and first drain electrically connected to the first light emitting element;
a second transistor having one of second source and second drain electrically connected to the second light emitting element;
a monitor line electrically connected to the other one of first source and first drain and the other one of second source and second drain;
a constant current source electrically connected to the monitor line;
a first circuit configured to turn off the first transistor when the first light emitting element is short-circuited, and provided between a first gate of the first transistor and one of first source and first drain; and
a second circuit configured to turn off the second transistor when the second light emitting element is short-circuited, and provided between a second gate of the second transistor and one of second source and second drain.

8. The light emitting device according to claim 7, wherein each of the first circuit and the second circuit is inverter.

9. The light emitting device according to claim 7, wherein each of the first circuit and the second circuit comprises a P-channel first transistor, an N-channel second transistor electrically connected to the P-channel first transistor in parallel, and an N-channel third transistor electrically connected to the N-channel second transistor in series.

10. The light emitting device according to claim 7, wherein each of the first circuit and the second circuit comprises a P-channel first transistor, a P-channel second transistor electrically connected to the P-channel first transistor in series, an N-channel third transistor electrically connected to the P-channel second transistor in parallel, and an N-channel fourth transistor having a gate electrically connected to the gate of the P-channel first transistor.

11. The light emitting device according to claim 7, further comprising a buffer amplifier circuit electrically connected to the other one of first source and first drain and the other of one second source and second drain.

12. The light emitting device according to claim 7, wherein the first transistor and the second transistor have P-channel conductivity.

13. A light emitting device comprising:
a monitoring circuit comprising:
a first light emitting element and a second light emitting element electrically connected to each other in parallel;
a first transistor having one of first source and first drain electrically connected to the first light emitting element;
a second transistor having one of second source and second drain electrically connected to the second light emitting element;
a first circuit configured to turn off the first transistor when the first light emitting element is short-circuited, and provided between a first gate of the first transistor and one of first source and first drain; and
a second circuit configured to turn off the second transistor when the second light emitting element is short-circuited, and provided between a second gate of the second transistor and one of second source and second drain,
a pixel portion comprising:
a third light emitting element;
a third transistor having one of third source and third drain electrically connected to the third light emitting element, and the other one of third source and third drain electrically connected to the other one of first source and first drain and the other one of second source and second drain.

14. The light emitting device according to claim 13, wherein each of the first circuit and the second circuit is inverter.

15. The light emitting device according to claim 13, wherein each of the first circuit and the second circuit comprises a P-channel first transistor, an N-channel second transistor electrically connected to the P-channel first transistor in parallel, and an N-channel third transistor electrically connected to the N-channel second transistor in series.

16. The light emitting device according to claim 13, wherein each of the first circuit and the second circuit comprises a P-channel first transistor, a P-channel second transistor electrically connected to the P-channel first transistor in series, an N-channel third transistor electrically connected to the P-channel second transistor in parallel, and an N-channel fourth transistor having a gate electrically connected to the gate of the P-channel first transistor.

17. The light emitting device according to claim 13, further comprising a buffer amplifier circuit electrically connected to the other one of first source and first drain and the other one of second source and second drain.

18. The light emitting device according to claim 13, wherein the first transistor and the second transistor have P-channel conductivity.

19. A driving method of a light emitting device comprising:
a first light emitting element and a second light emitting element electrically connected to each other in parallel;
a first transistor having one of first source and first drain electrically connected to the first light emitting element;
a second transistor having one of second source and second drain electrically connected to the second light emitting element;
a first circuit provided between a first gate of the first transistor and one of first source and first drain; and
a second circuit provided between a second gate of the second transistor and one of second source and second drain,
comprising the step of:
turning off the first transistor by the first circuit when the first light emitting element is short-circuited, and
turning off the second transistor by the second circuit when the second light emitting element is short-circuited.

20. The driving method of the light emitting device according to claim 19, wherein each of the first circuit and the second circuit is inverter.

21. The driving method of the light emitting device according to claim 19, wherein each of the first circuit and the second circuit comprises a P-channel first transistor, an N-channel second transistor electrically connected to the P-channel first transistor in parallel, and an N-channel third transistor electrically connected to the N-channel second transistor in series.

22. The driving method of the light emitting device according to claim 19, wherein each of the first circuit and the second circuit comprises a P-channel first transistor, a P-channel second transistor electrically connected to the P-channel first transistor in series, an N-channel third transistor electrically connected to the P-channel second transistor in parallel, and an N-channel fourth transistor having a gate electrically connected to the gate of the P-channel first transistor.

23. The driving method of the light emitting device according to claim 19, further comprising a buffer amplifier circuit electrically connected to the other of first source and first drain and the other of second source and second drain.

24. The driving method of the light emitting device according to claim 19, wherein the first transistor and the second transistor have P-channel conductivity.

* * * * *